(12) United States Patent
Zhang et al.

(10) Patent No.: US 11,587,629 B2
(45) Date of Patent: Feb. 21, 2023

(54) DETECTING LATENT DEFECTS IN A MEMORY DEVICE DURING AN ERASE OPERATION BASED ON PHYSICAL AND LOGICAL SEGMENT FAIL BITS

(71) Applicant: Western Digital Technologies, Inc., San Jose, CA (US)

(72) Inventors: Ke Zhang, Shanghai (CN); Liang Li, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 39 days.

(21) Appl. No.: 17/341,814

(22) Filed: Jun. 8, 2021

(65) Prior Publication Data

US 2022/0392548 A1    Dec. 8, 2022

(51) Int. Cl.
*G11C 16/34*    (2006.01)
*G11C 11/56*    (2006.01)
*G11C 16/16*    (2006.01)
*G11C 16/04*    (2006.01)

(52) U.S. Cl.
CPC ........ *G11C 16/345* (2013.01); *G11C 11/5635* (2013.01); *G11C 11/5671* (2013.01); *G11C 16/0483* (2013.01); *G11C 16/16* (2013.01)

(58) Field of Classification Search
CPC ... G11C 16/345; G11C 16/0483; G11C 16/16; G11C 11/5635; G11C 11/5671
See application file for complete search history.

(56) References Cited

U.S. PATENT DOCUMENTS

| | | | |
|---|---|---|---|
| 7,545,681 B2 | 6/2009 | Li et al. | |
| 8,427,884 B2 | 4/2013 | Liu et al. | |
| 8,516,339 B1 | 8/2013 | Lesea et al. | |
| 8,560,927 B1 | 10/2013 | Pagiamtzis et al. | |
| 8,681,548 B2 | 3/2014 | Liu et al. | |
| 8,830,756 B2 | 9/2014 | Mu et al. | |
| 9,214,240 B2 * | 12/2015 | Dutta | G11C 16/16 |
| 9,330,778 B2 * | 5/2016 | Costa | G11C 16/3445 |
| 10,297,337 B2 | 5/2019 | Tsai et al. | |
| 10,381,095 B1 * | 8/2019 | Date | G11C 16/16 |
| 11,004,535 B1 | 5/2021 | Hsu et al. | |
| 2019/0122741 A1 * | 4/2019 | Cheng | G11C 16/3495 |

* cited by examiner

*Primary Examiner* — Connie C Yoha
(74) *Attorney, Agent, or Firm* — Vierra Magen Marcus LLP

(57) ABSTRACT

Apparatuses and techniques are described for detecting latent defects in a memory device by considering both physical segment and logical segment fail bits in an erase operation. The erase operation involves performing a series of erase loops until the memory cells pass an erase-verify test. The passing of the erase-verify test is based on counting memory cells in different logical segments which fail the verify test and determining that the count is less than a logical segment threshold for each logical segment. Subsequently, the technique involves counting memory cells in each physical segment which fail the erase-verify test and determining whether the count is less than a physical segment threshold. If the count is equal to or greater than the physical segment threshold for one or more of the physical segments, the block of memory cells is marked as being bad.

20 Claims, 17 Drawing Sheets

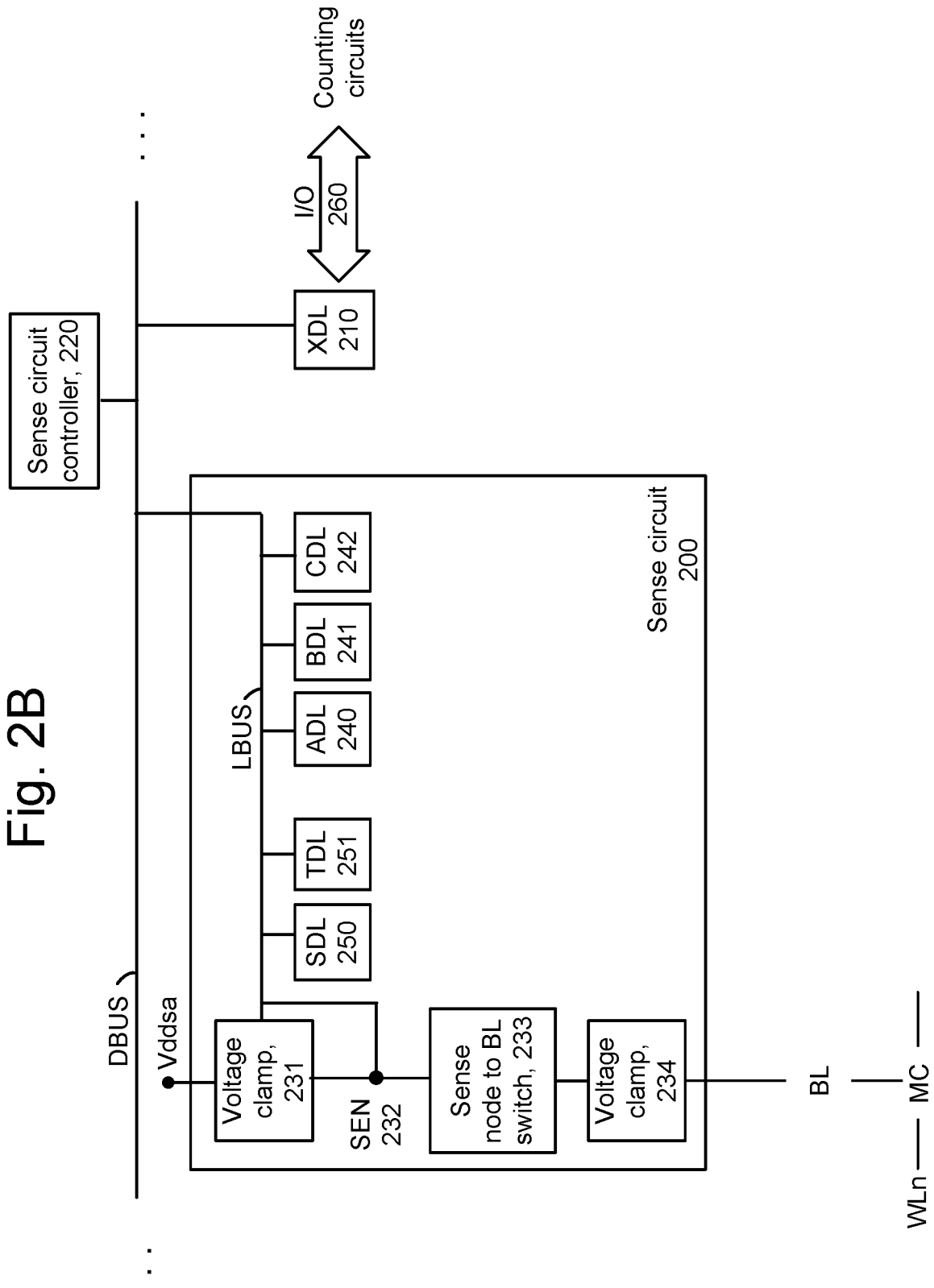

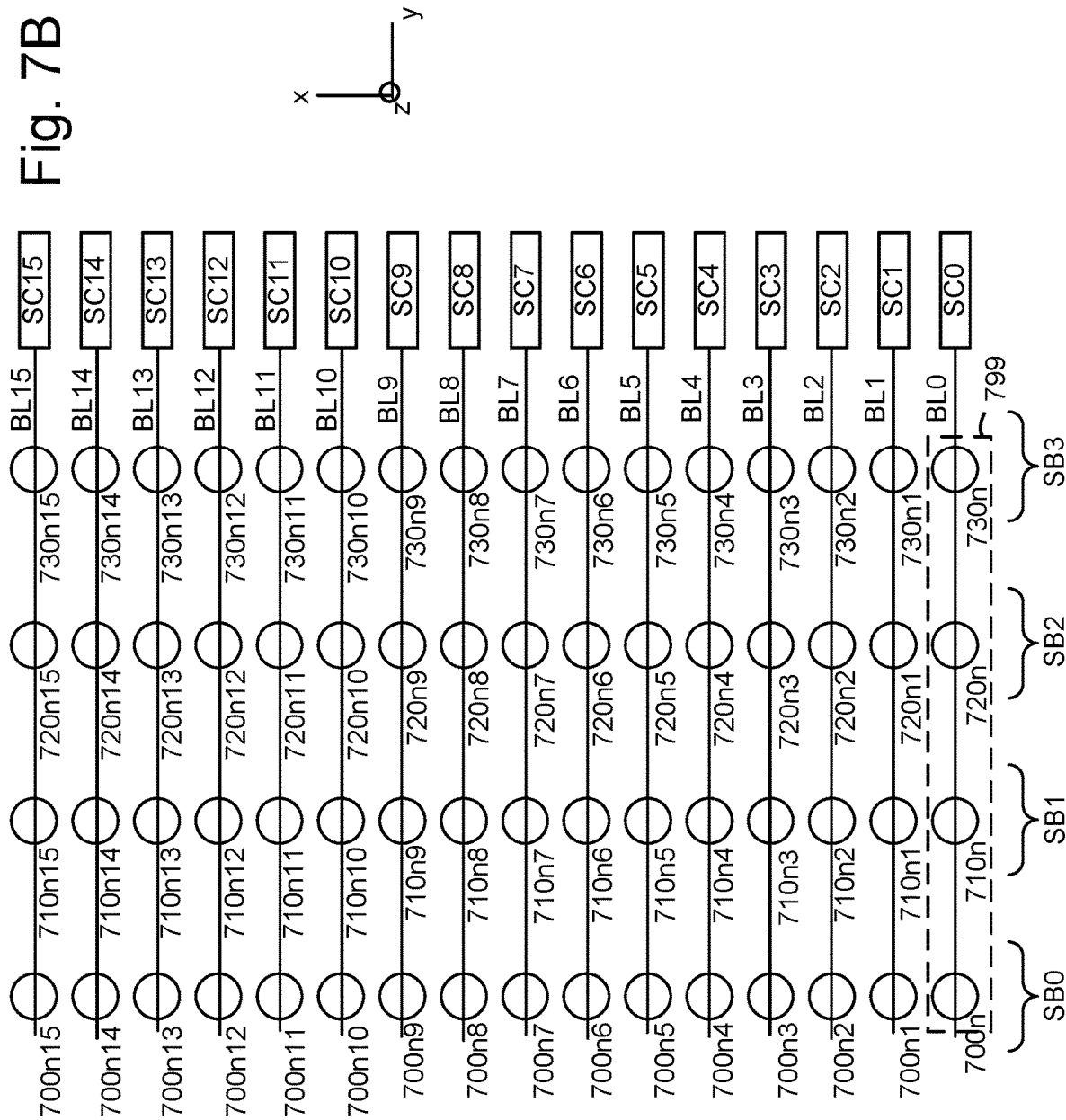

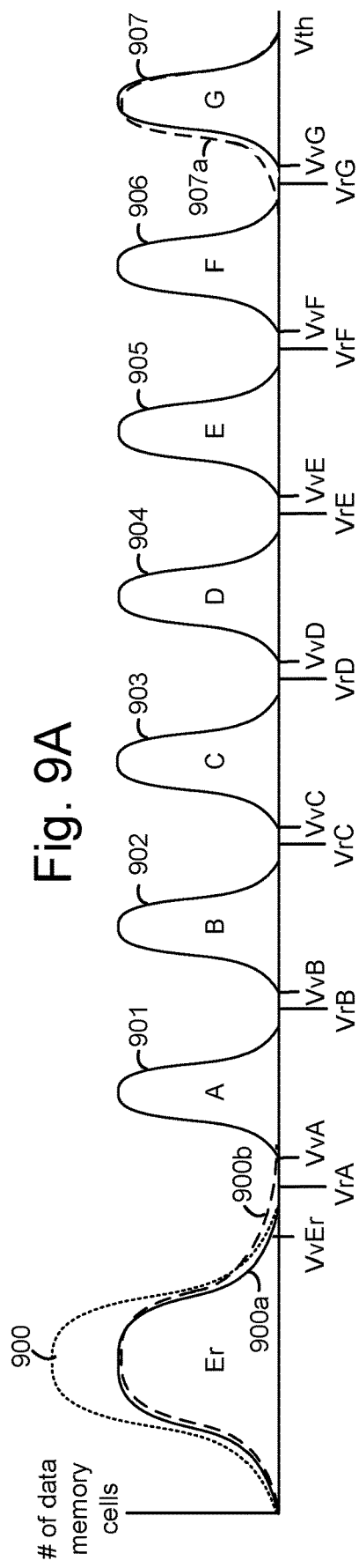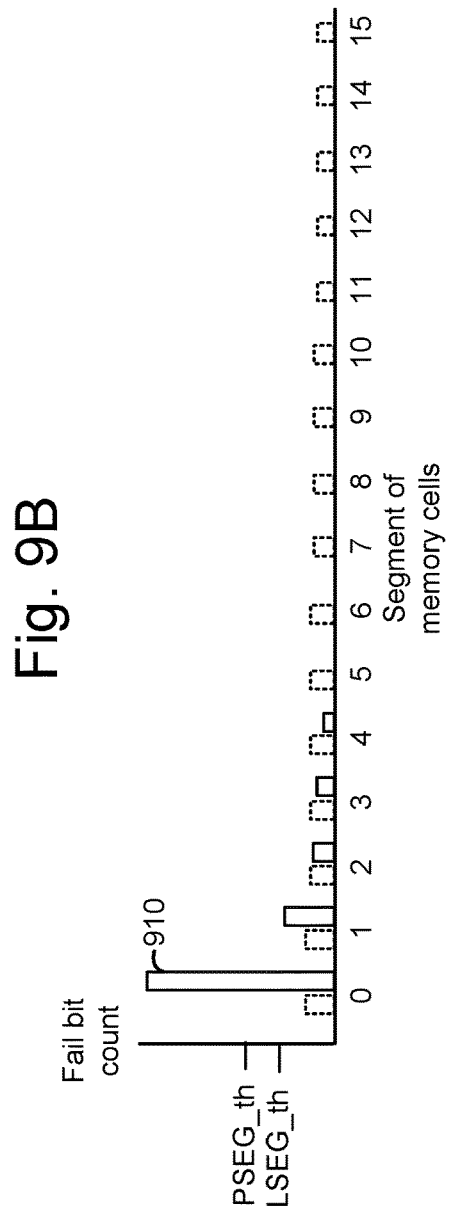

DETECTING LATENT DEFECTS IN A MEMORY DEVICE DURING AN ERASE OPERATION BASED ON PHYSICAL AND LOGICAL SEGMENT FAIL BITS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2B depicts an example block diagram of the sense circuit 200 of FIG. 2.

FIG. 7B depicts an example top view of the block B0-0 of FIG. 7A, with respective NAND strings, bit lines and sense circuits.

FIG. 9A depicts threshold voltage (Vth) distributions for memory cells in an eight-state memory device, including an erased state with an upper tail which can result in read errors.

FIG. 9B depicts a plot of a fail bit count versus a segment of memory cells, where the bar charts with the solid lines denote a physical segment and the bar charts with the dashed lines denote a logical segment.

DETAILED DESCRIPTION

Figure 1A:
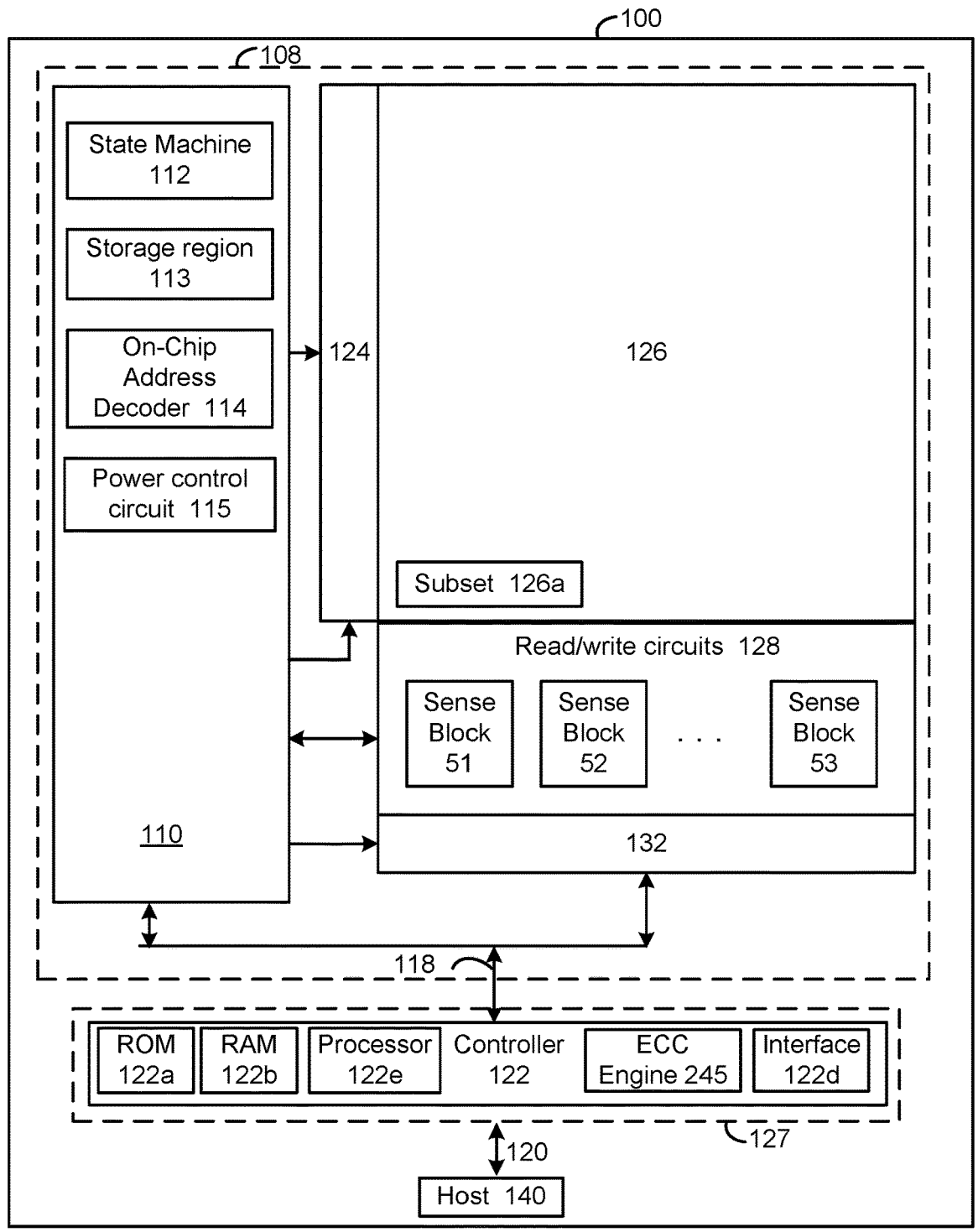
FIG. 1A is a block diagram of an example memory device.

Apparatuses and techniques are described for detecting latent defects in a memory device by considering both physical segment and logical segment fail bits in an erase operation.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to a substrate and a drain end of the NAND string is connected to a bit line.

In particular, 3D NAND flash memory is widely used for storage in consumer devices, enterprise systems and industrial applications because of its non-volatility, affordability, high storage density and high access speed.

2D memory devices are also widely used. In a 2D memory structure, the memory cells may be arranged in horizontal NAND strings on a substrate.

An erase operation for memory cells in a block typically involves one or more erase-verify iterations, also referred to as erase loops, where each iteration involves channel boosting followed by a verify test for the memory cells, until the erase operation is completed. In an erase loop, the NAND strings and their memory cells are biased for erase by boosting the voltages of the channels while holding the voltages of the word lines at a low level, e.g., at or close to 0 V. The channels are boosted by applying one or more erase pulses to the block. In one approach, the erase pulse is applied to the substrate, causing holes to be injected into the channels via the source ends of the NAND strings. In another approach, the channels are boosted by generating holes at the source end and/or drain end of the NAND strings using gate-induced drain leakage (GIDL). This involves providing a strong back bias of the SGS and/or SGD transistors, respectively.

The boosting of the channels creates a large channel-to-gate voltage which drives holes into the charge trapping layers, lowering the threshold voltage (Vth) of the memory cells. A verify test, which is a sensing operation, can be performed after the application of the erase pulse to determine if the Vth of the memory cells has been lowered below a verify voltage, VvEr. A verify test typically tests the erase level of a set of NAND strings by sensing a current in the set of NAND strings. The current can be indicated by the amount of voltage discharge of a sense node in a sense circuit. The erase operation is completed when the verify test is passed by all, or nearly all, of the sets of NAND strings.

However, the verify test may be passed even when there are defects in the memory cells which result in subsequent read errors. For example, a short circuit between a word line and a memory hole can result in a leaky current path which is not strong enough to cause a failure in a program or erase operation, but is strong enough to cause a read error. One failure mode involves the upper tail of the Vth distribution for the erased state memory cells increasing above the A state read level. The erased state memory cells having a Vth in the upper tail will be read incorrectly as A state cells instead of erased state cells. This failure mode worsens as the memory device accumulates program-erase cycles, and is therefore difficult to detect using screening processes at the time of manufacture.

Error correcting codes (ECC) can correct some read errors. The ECC is typically applied to logical segments of memory cells rather than an entire page of memory cells, where each logical segment is defined by logical column addresses, to improve the ECC coverage ability. A set of ECC bits is provided for each logical segment. This approach can be convenient such as when the segment represents a unit of data transfer to and from the host system. The columns in a logical segment are evenly distributed across the page and have inconsecutive physical addresses. A column may represent a number of memory cells which store a word of user data, such as two bytes. A column can similarly represent the same number of NAND strings.

Due to the use of logical segments, a cluster of defective memory cells which are physically close together in one physical segment, based on failure modes such as discussed above, will be dispersed across different logical segments and can be corrected by the ECC. The defect is therefore masked and may not be apparent until a later time which results in the loss of user data.

Techniques provided herein address the above and other issues. In one aspect, a technique for detecting defects is implemented in an erase operation. The erase operation involves performing a series of erase loops until the memory cells pass an erase-verify test. The passing of the verify test is based on counting memory cells in different logical segments which fail the verify test, and determining that the count is less than a logical segment threshold for each logical segment. Subsequently, the technique involves counting memory cells in each physical segment which fail the verify test, and determining whether the count is less than a physical segment threshold.

If the count is equal to or greater than the physical segment threshold for one or more of the physical segments, the block of memory cells is marked as being bad since a defect is likely to be present. If the count is less than the physical segment threshold for each of the physical segments, the block of memory cells is good. In this case, the verify test can be performed for another set of memory cells, such as in another sub-block, if applicable. Or, a pass status can be set for the erase operation since the erase operation is successfully completed and a defect is not likely to be present.

Counting circuits can be provided to count the number of memory cells which fail the erase-verify test. In one approach, the memory cells are arranged in groups of memory cells, where each group comprises one or more columns. A count can be obtained for each group and these counts summed to obtain the count of a logical or physical segment. The counts are obtained by scanning sense circuits to obtain a bit of data for each NAND string indicating a pass or fail status for an erase-verify test. For example, a 1 bit may be referred to as a pass bit while the 0 bit is a fail bit. A counting circuit can count the number of fail bits and determine if the number is below a threshold such as 1% of the NAND strings.

The defect detection techniques can be performed with little or no time penalty by scanning the sense circuits one time and using the resulting pass/fail bits to obtain the counts for both the logical and physical segments.

The logical segment threshold can be equal to, or different than, the physical segment threshold.

The defect detection process can be implemented during each erase operation, or at other times, such as in response to the number of program-erase cycles exceeding a threshold.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, ... 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115.

A storage region 113 may also be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, ..., 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As anon-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
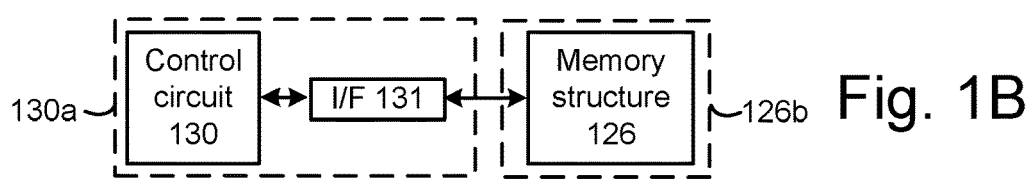
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2A:
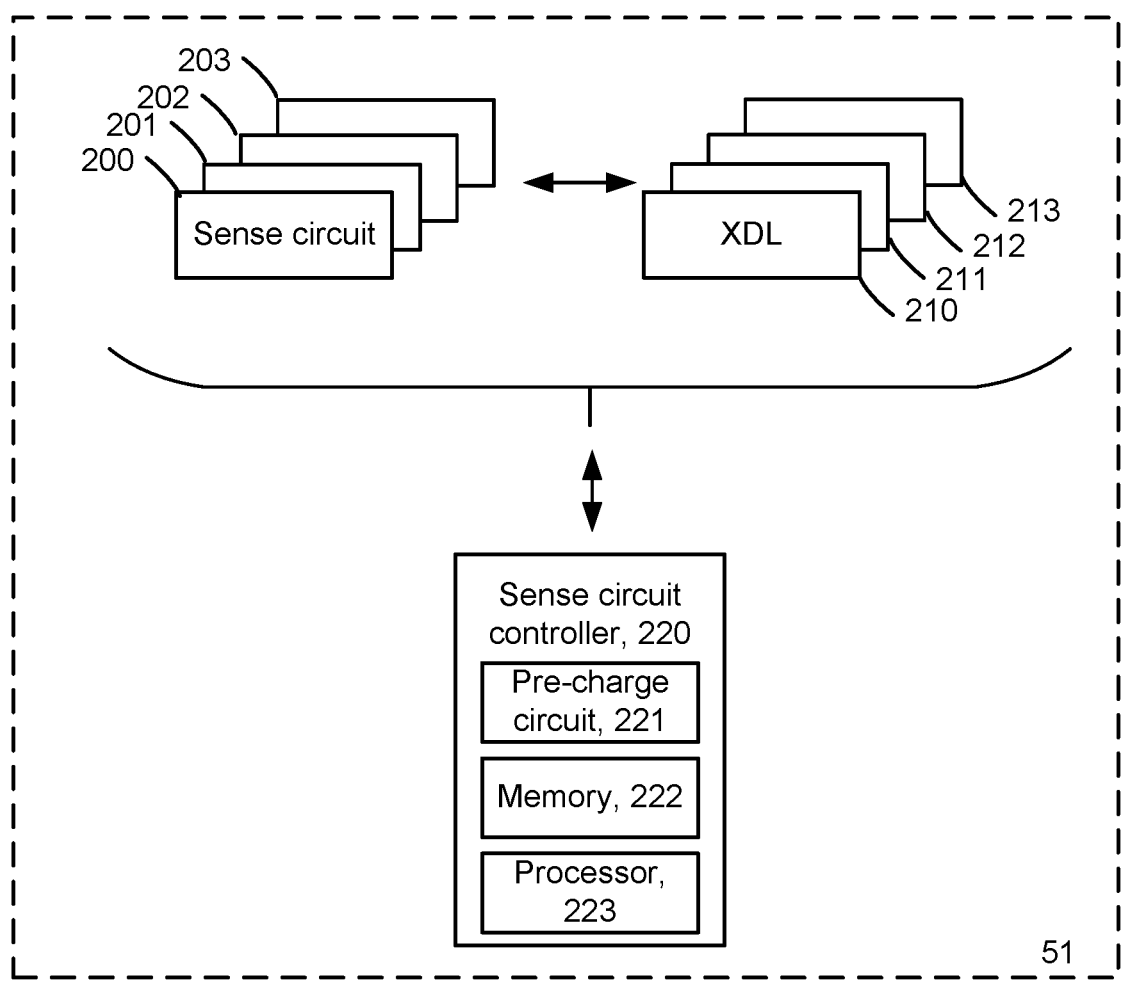
FIG. 2A depicts an example block diagram of the sense block 51 in the column control circuitry of FIG. 1A.

FIG. 2A depicts an example block diagram of the sense block 51 in the column control circuitry of FIG. 1A. The column control circuitry can include multiple sense blocks, where each sense block performs sensing, e.g., read or verify operations, for multiple memory cells via respective bit lines.

In one approach, a sense block comprises multiple sense circuits, also referred to as sense amplifiers. Each sense circuit is associated with data latches and caches. For example, the example sense circuits 200-203 are associated with data transfer latches (XDL) 210-213, respectively, external to the sense circuits. Each XDL latch is an example of a cache.

In one approach, different subsets of bit lines can be sensed using different respective sense blocks. This allows the processing load which is associated with the sense circuits to be divided up and handled by a respective processor in each sense block. For example, a sense circuit controller 220 can communicate with the set, e.g., sixteen, of sense circuits and associated latches. The sense circuit controller may include a pre-charge circuit 221 which provides a voltage to each sense circuit for setting a pre-charge voltage. In one possible approach, the voltage is provided to each sense circuit independently, e.g., via a data bus DBUS and a local bus LBUS, such as depicted in FIG. 2B. In another possible approach, a common voltage is provided to each sense circuit concurrently. The sense circuit controller may also include a memory 222 and a processor 223.

FIG. 2B depicts an example block diagram of the sense circuit 200 of FIG. 2. The sense circuit controller 220 is also depicted, along with the XDL latch 210. The sense circuit controller 220 communicates with multiple sense circuits including the example sense circuit 200. The sense circuit includes internal latches SDL 250 and TDL 251 and internal user data latches ADL 240, BDL 241 and CDL 242, in a three bit per cell example. SDL is a latch which is used to set the bit line voltage and the sense node voltage based on whether a very test is to be performed. TDL is a latch which may store the result of a verify test. ADL, BDL and CDL store user data for a program operation but are not used in an erase operation.

The sense circuit further includes a voltage clamp 231 such as a transistor which sets a pre-charge voltage at a sense node 232 (SEN). A sense node-to-bit line (BL) switch 233 selectively allows the sense node to communicate with a bit line BL. The bit line is connected to a respective memory cell MC such as in a respective NAND string. The example memory cell MC is connected to a selected word line WLn. A voltage clamp 234 can set a voltage on the bit line, such as during a sensing operation or during a program pulse.

A local bus, LBUS, allows the sense circuit controller to communicate with components in the sense circuit, such as the latches and the voltage clamp. The sense circuit controller communicates with LBUS in each sense circuit via another bus, DBUS, which is external to, and connected to, a set of sense circuits. The communicating can include sending data to the sense circuits and/or receive data from the sense circuits. The sense circuit controller can communicate with different sense circuits in a time-multiplexed manner, for instance.

The XDL latch is external to the sense circuit 200 and is accessed on DBUS. XDL and DBUS can further communicate with counting circuits such as in FIGS. 12 and 13, and with a control circuit, via an input/output (I/O) path 260.

Figure 3:
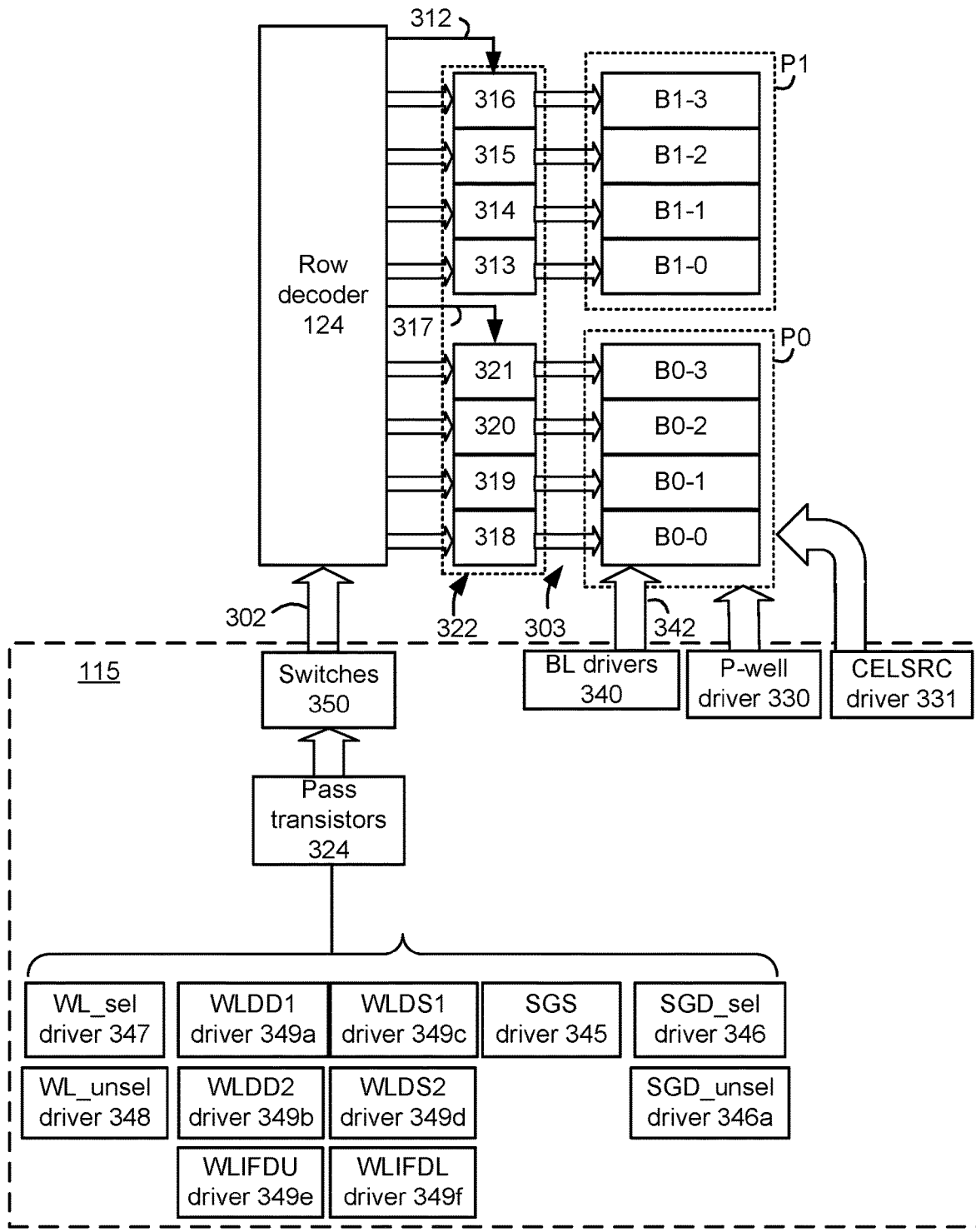
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_unsel driver 348 provides a voltage signal on unselected data word lines. A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIG. 6. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346*a* for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612*b* in the p-well region 612, e.g., via the conductive path 682. See FIG. 6. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612*c* in the p-well region, e.g., via the local interconnect 651 in FIG. 6.

Bit line (BL) voltage drivers 340 include voltage sources which provide voltages to the bit lines 342. The bit line voltage for sensing can be 0.5 V, for example.

Figure 4:
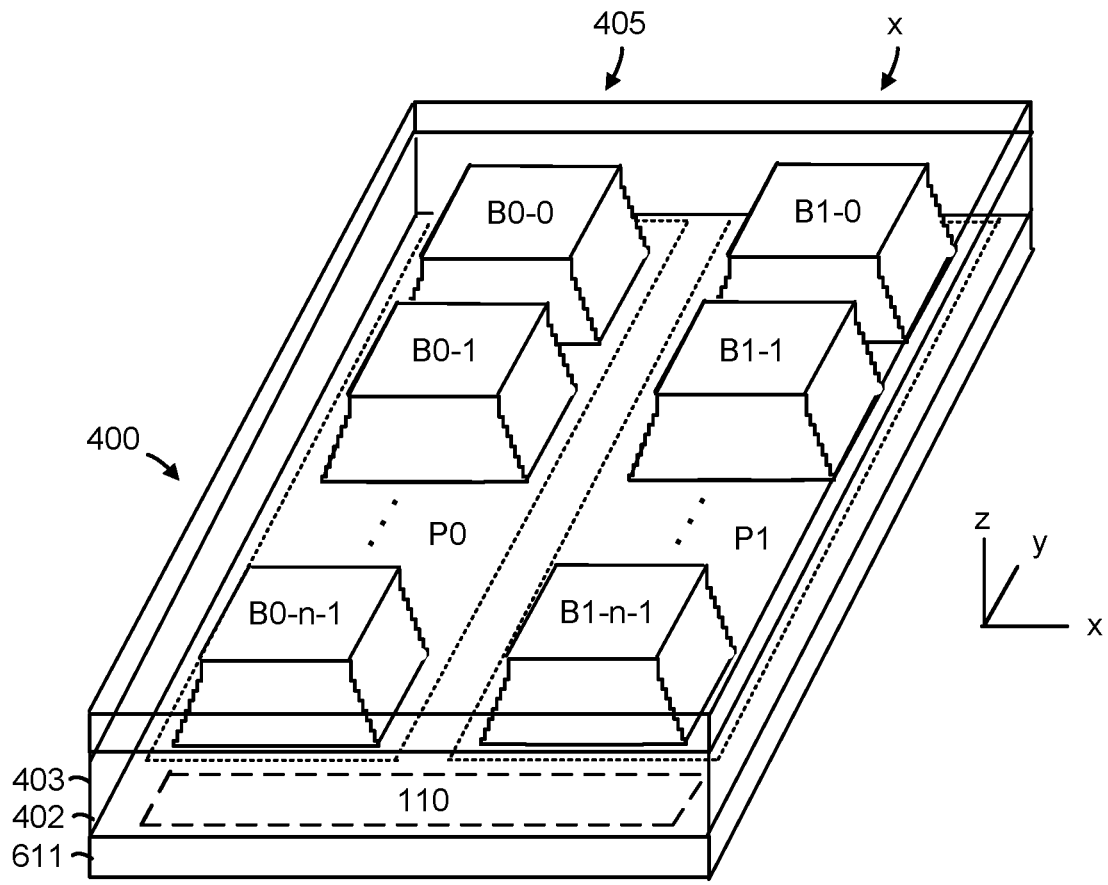
FIG. 4 is a perspective view of an example memory die 400 in which blocks are provided in respective planes P0 and P1, consistent with FIG. 1A.

FIG. 4 is a perspective view of an example memory die 400 in which blocks are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-*n*–1, are formed in P0, and a second block sequence 415 of a number n blocks, labelled B1-0 to B1-*n*–1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
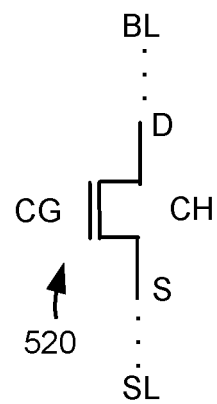
FIG. 5 depicts an example transistor 520 in the memory structure 126 of FIG. 1A.
Figure 6:
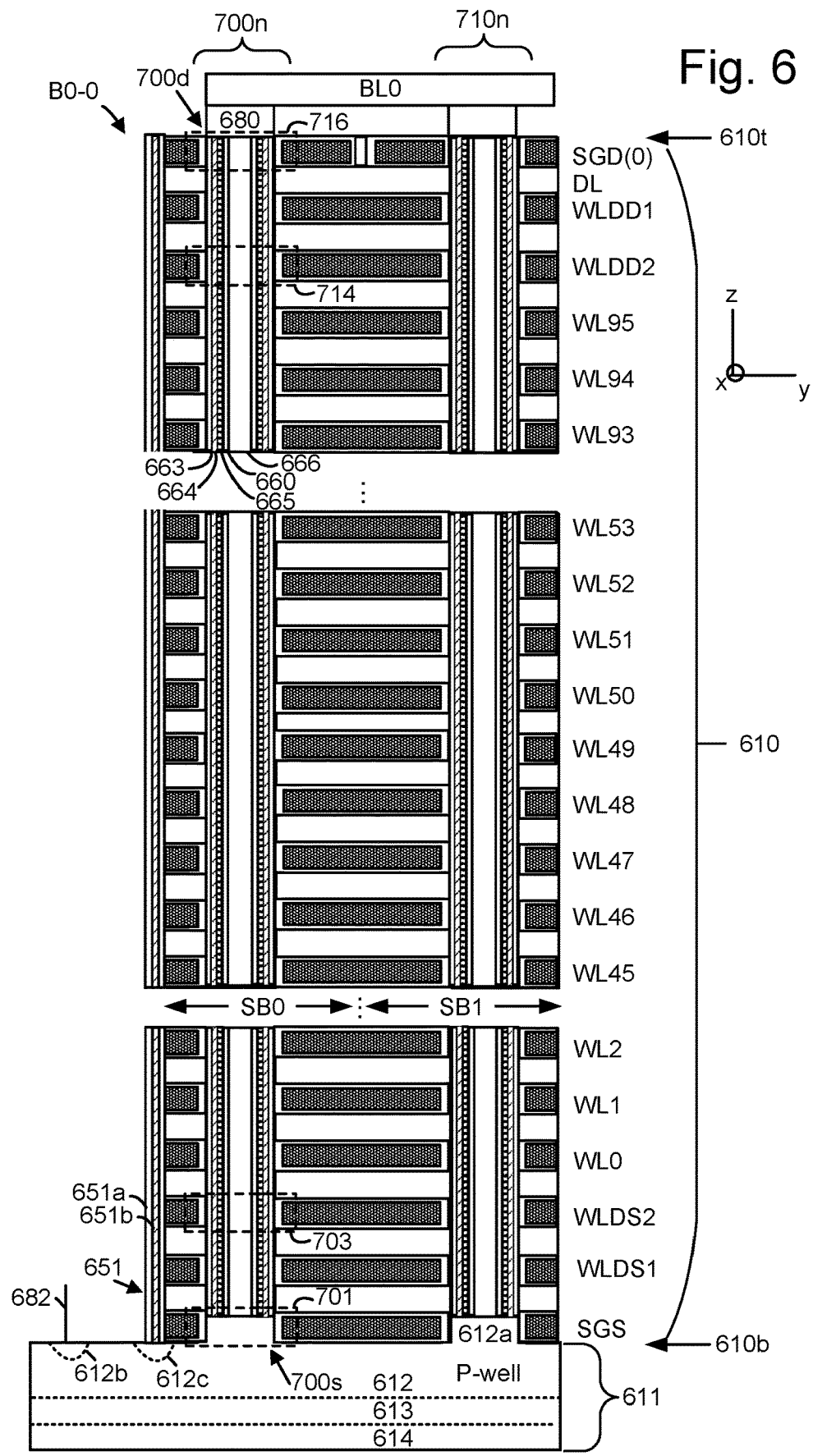
FIG. 6 depicts an example cross-sectional view of a portion of the block B0-0 of FIG. 4, including NAND strings 700n and 710n, in a single-tier stack.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6 depicts an example cross-sectional view of a portion of the block B0-0 of FIG. 4, including NAND strings 700*n* and 710*n*, in a single-tier stack. In this example, the NAND strings 700*n* and 710*n* are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. For example, a two-tier stack can be formed by first forming a lower stack, and etching memory holes in the lower stack. An interface region is then formed on the lower stack, and an upper stack is formed on the interface region. Memory holes are then etched in the upper stack and the interface region to connect to the memory holes in the lower stack, forming memory holes which extend a height of the stack.

A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost, drain-side data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665. As a result, there is a reduced likelihood of a Vth shift. The verify operations as discussed herein can be omitted for the SGS transistors, in one approach. In another possible approach, the verify operations as discussed herein can be included for the SGS transistors.

Figure 7A:
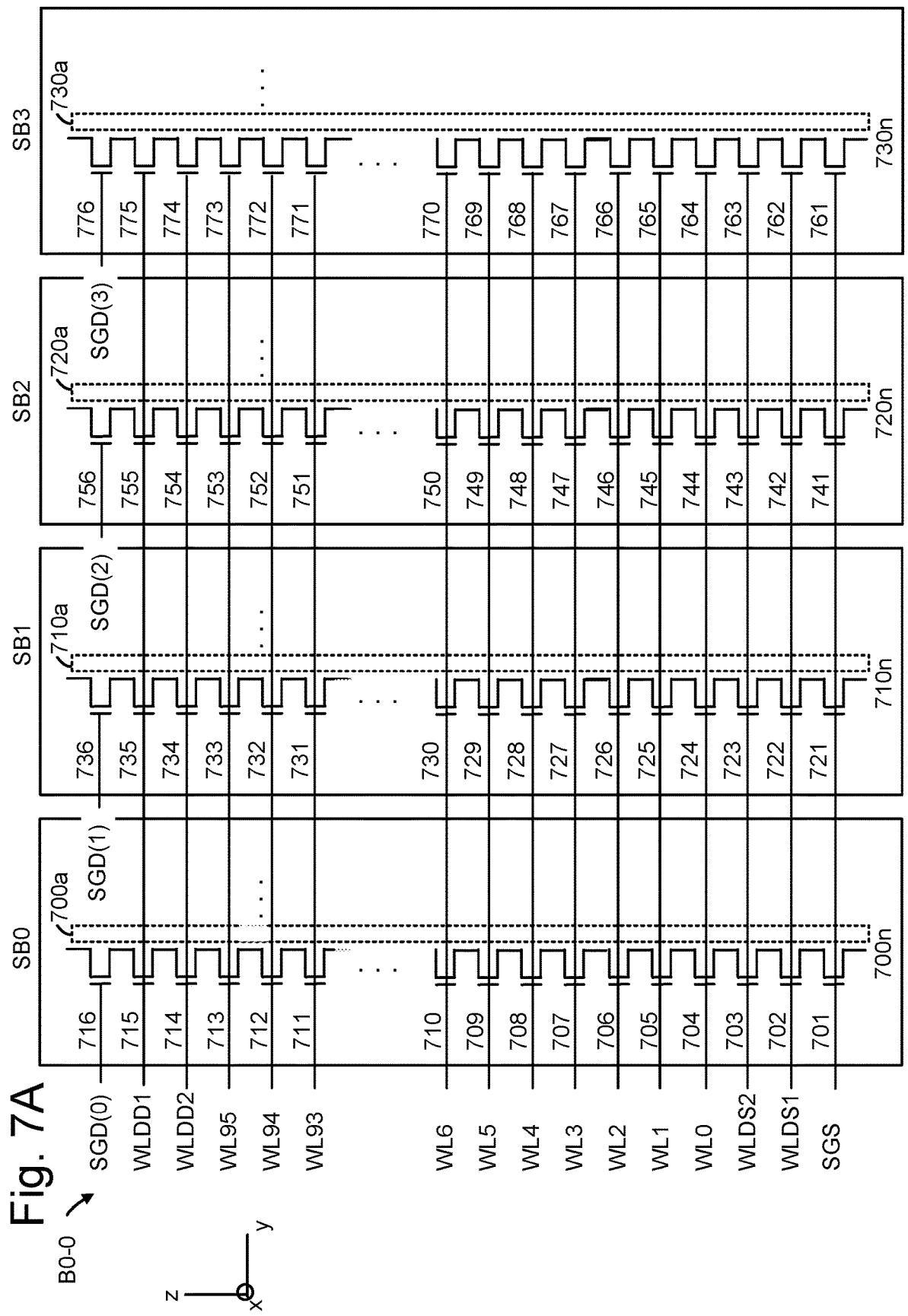
FIG. 7A depicts an example view of NAND strings in the block B0-0 which is consistent with FIGS. 4 and 6.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible. The verify tests for the erase operation may be performed one sub-block at a time or for all sub-blocks concurrently.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD(2) and SGD(3), respectively, in one approach.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit. For example, BL0-BL15 are connected to sense circuits SC0-SC15, respectively.

In a verify test in an erase operation, a verify voltage VvEr is applied to the word lines. See FIG. 9A. At the same time, each sense circuit senses a current on a respective bit line based on a sum of the currents in the respective NAND strings connected to the bit line. For example, when all sub-blocks are sensed concurrently, SC0 can sense a current on BL0 based on currents in the NAND strings 700n, 710n, 720n and 730n. Thus, a verify test can involve sensing a current in a set of NAND strings connected to each bit line. A set of NAND strings passes the verify test if the current is above a specified level, e.g., the threshold voltages of the memory cells in the set of NAND strings are below the verify voltage. A block passes the verify test if all, or nearly all, of the set of NAND strings pass the verify test. In other words, a block passes the verify test if none, or no more than a specified portion of the sets of NAND strings of the block, fail the verify test. In another possible approach, the sensing occurs one sub-block at a time for each bit line.

A NAND string can pass or fail a verify test when a verify voltage is applied to the word lines. A NAND string fails a verify test when the current in the NAND string is relatively low such that a sense node voltage is relatively high. A failure indicates the Vth is higher than the verify voltage for one or more memory cells in the NAND string. In contrast, a NAND string passes a verify test when the current in the NAND string is relatively high such that a sense node voltage is relatively low. A pass indicates the Vth is lower than the verify voltage for all of the memory cells in the set of NAND strings.

A set of NAND strings, which may comprise all NAND strings in a block or sub-block, for example, can be considered to pass a verify test when all or nearly all of the NAND strings pass the verify test. For example, a pass may occur when no more than 1-5% of the NAND strings fail the verify test. In practice, it is simpler for the circuitry to count the number of NAND strings which fail the verify test rather than to count the much larger number of NAND strings which pass the verify test.

Figure 8:
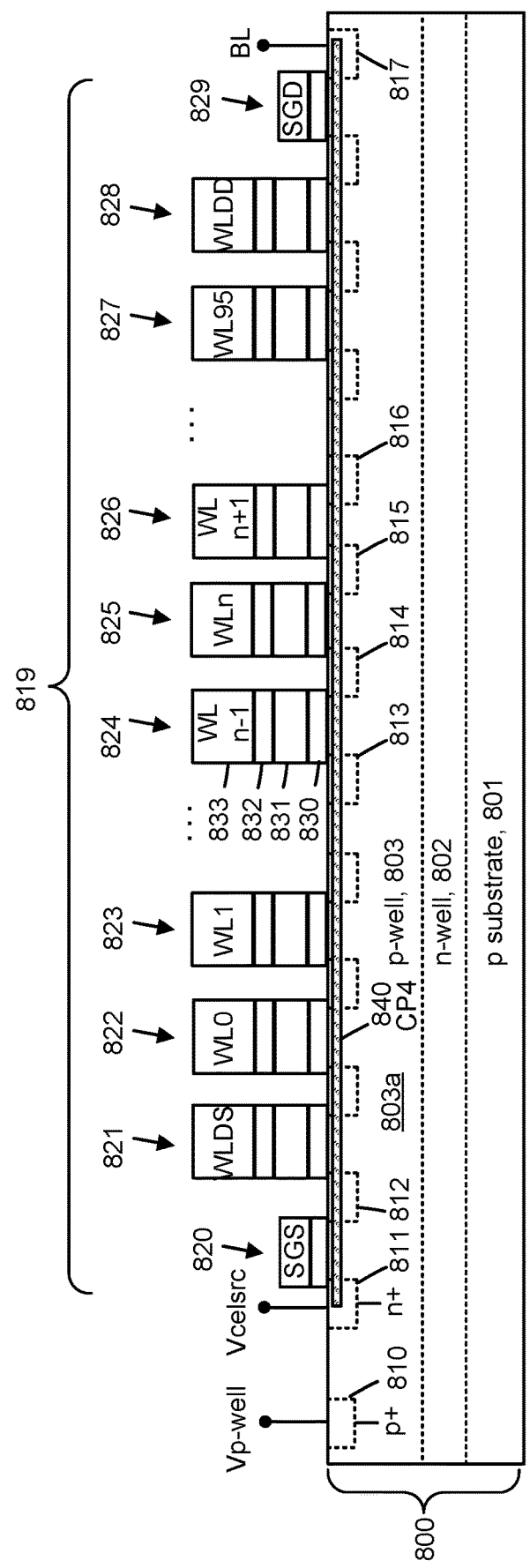
FIG. 8 depicts an example NAND string in a 2D configuration.

FIG. 8 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunnel oxide layer 830, a floating gate layer 831, a blocking oxide layer 832 and a control gate 833.

FIG. 9A depicts threshold voltage (Vth) distributions for memory cells in an eight-state memory device, including an erased state with an upper tail which can result in read errors. Eight data states, or three bits per cell, are depicted as an example. The techniques herein can apply to other modes including one or more bits per cell. The vertical axis depicts a number of memory cells on a logarithmic scale and the horizontal axis depicts a threshold voltage on a linear scale. The Vth distributions can represent memory cells connected to a word line or all memory cells in a block. The memory cells may be arranged in NAND strings, in one example. After erasing the block, the Vth distribution 900 is obtained. Subsequently, after programming, the erased state Vth distribution 900a or 900b, and the programmed state Vth distributions 901-907, are obtained. The Vth distribution 900a represents the erased state for a non-defective block or sub-block. The Vth distribution 900 represents the erased state for a defective block or sub-block. The Vth distribution in this case has an upper tail which exceeds the A state read voltage, VrA, resulting in read errors.

The erase operation is completed when a verify test indicates the Vth of all, or nearly all, of the memory cells is below a verify voltage, VvEr. In one approach, the verify test involves all word line sensing, where a current through the NAND strings is sensed by the sense circuits while VvEr is applied to each memory cell. In another approach, the verify test involves even-odd word line sensing, where a current through the NAND strings is sensed by the sense circuits while VvEr is applied to the memory cells connected to the even-numbered word lines and Vread is applied to the memory cells connected to the odd-numbered word lines, and separately, a current through the NAND strings is sensed by the sense circuits while VvEr is applied to the memory cells connected to the odd-numbered word lines and Vread is applied to the memory cells connected to the even-numbered word lines. A NAND string can be considered to pass the verify test if the verify tests for both even- and odd-numbered word lines are passed. Otherwise, a NAND string can be considered to fail the verify test.

During an erase-verify test, the state machine or other control circuit checks the number of NAND strings are non-conductive and therefore fail the verify test. If this number is larger than predefined value, then another erase pulse and erase-verify are used.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 901-907, respectively. These memory cells are subject to verify tests using verify voltages of VvA-VvG. During programming, another possible failure mode involves a lower tail of the G state, as represented by the Vth distribution 907a, falling below the G state read voltage, VrG, resulting in read errors.

FIG. 9B depicts a plot of a fail bit count versus a segment of memory cells, where the bar charts with the solid lines denote a physical segment and the bar charts with the dashed lines denote a logical segment. This example has sixteen segments, 0-15. A segment of memory cells can also be considered to be a segment of NAND strings or a segment of a sub-block. A fail bit count represents a number of NAND strings which fail an erase-verify test in an erase operation. The counts are arranged for each logical and physical segment and arranged in a descending order from left to right in the plot. The greatest number of fail bits is represented by the bar chart 910 in segment 0. This number of fail bits exceeds a physical segment threshold, PSEG_th. The number of fail bits for the remaining physical segments 1-15 does not exceed the threshold. In contrast, the bar charts for each of the logical segments has relatively low magnitude which is less than a logical segment threshold, LSEG_th.

These plots show that a relatively large number of fail bits due to a defect can be clustered in one physical segment even when the number of fail bits in each logical segment is relatively small.

Figure 10:
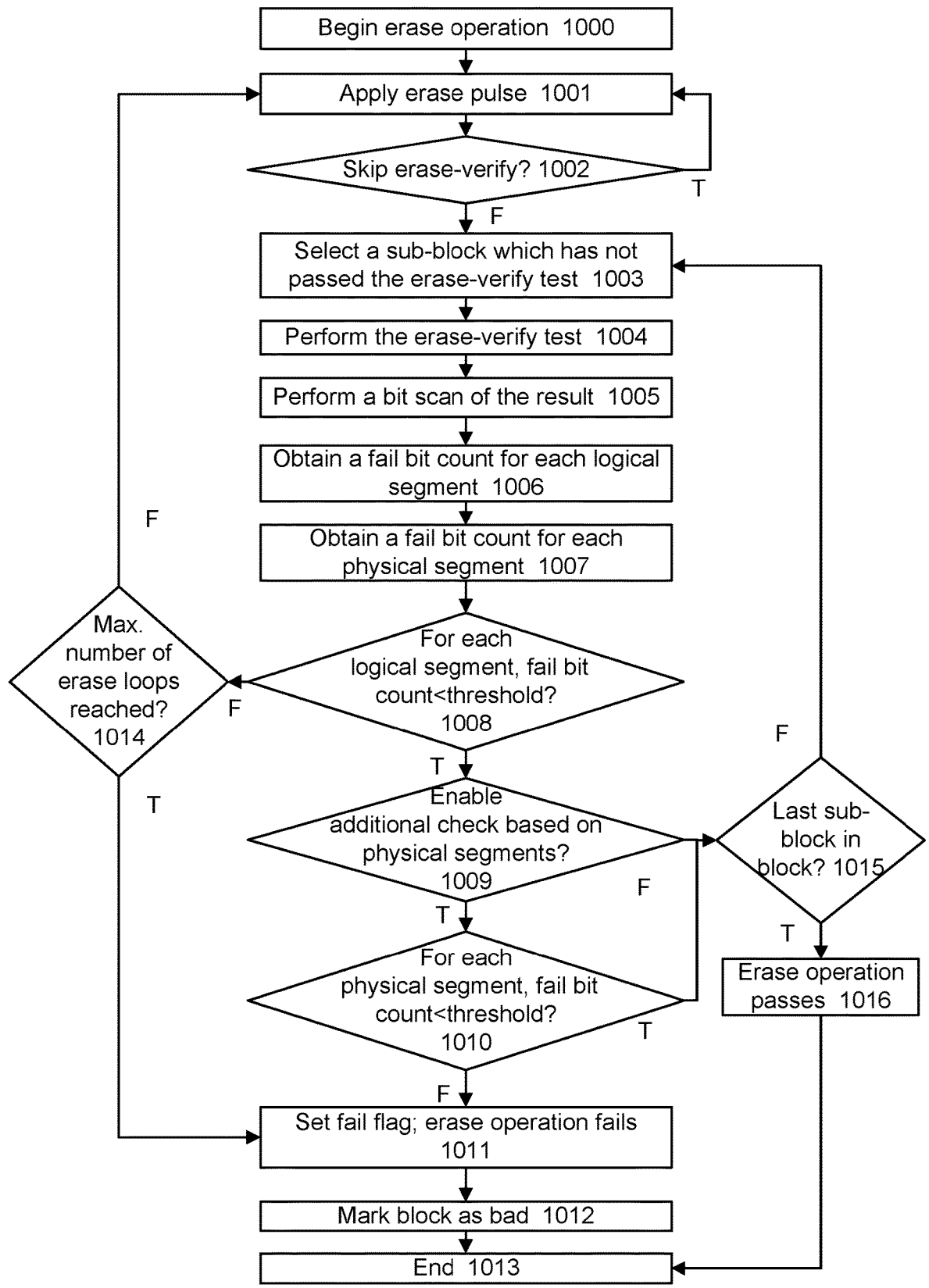
FIG. 10 depicts a flowchart of an erase operation which obtains an error count for logical and physical segments of memory cells, as part of a defect detection process.

FIG. 10 depicts a flowchart of an erase operation which obtains an error count for logical and physical segments of memory cells, as part of a defect detection process. As mentioned, the defect detection process can be implemented during each erase operation or at other times, such as in response to the number of program-erase cycles exceeding a threshold.

An erase operation begins at step 1000, typically for a block of memory cells. Step 1001 includes applying an erase pulse to the block. In one approach, the erase pulse is applied to the substrate, causing holes to be injected into the channels via the source ends of the NAND strings. In another approach, the channels are boosted by generating holes at the source end and/or drain end of the NAND strings using gate-induced drain leakage (GIDL). A decision step 1002 determines whether to skip an erase-verify test, as an option. If the decision step is true (T), the next erase pulse is applied at step 1001 without performing a verify test. If the decision step 1002 is false (F), step 1003 selects a sub-block which has not passed the erase-verify test. This example assumes the verify tests are performed one sub-block at a time, to help ensure that the sub-block are uniformly erased.

Step 1004 involves performing the erase-verify test. As mentioned, the erase-verify test can involve all word lines concurrently. Or, an erase-verify test can comprise an erase-verify test for even-numbered word lines and a separate erase-verify test for odd-numbered word lines.

Step 1005 includes performing a bit scan of the result of the erase-verify test. For example, this can involve each sense circuit providing a pass/fail bit of a NAND string to a counting circuit, such as discussed further below in connection with FIG. 12-16. Step 1006 includes obtaining a fail bit count for each logical segment. This can be a first count of NAND strings which fail the verify test in each logical segment of a plurality of logical segments.

Step 1007 includes obtaining a fail bit count for each physical segment. This can be a second count of NAND strings which fail the verify test in each physical segment of a plurality of physical segments. In one approach, the obtaining of the first and second counts in steps 1006 and 1007 can be done concurrently in a common counting process, e.g., involving tag circuits. The two steps are shown separately for clarity. A decision step 1008 determines whether, for each logical segment, the fail bit count is less than a threshold, e.g., a logical segment threshold, LSEG_th. If the decision step 1008 is false, a decision step 1014 determines whether a maximum number of erase loop has been reached. If the decision step 1014 is false, a next erase pulse is applied in a next erase loop at step 1001. When the decision step 1008 is false, the first count is greater than, or equal to, the logical segment threshold for at least one of the logical segments, and a control circuit is configured to bias the set of NAND strings again for erase.

If the decision step 1014 is true, step 1011 sets a fail flag for the block and the erase operation fails. Step 1012 marks the block as being bad and the process ends at step 1013.

If the decision step 1008 is true, the sub-block is considered to be successfully erased from the standpoint of the logical segments. A decision step 1009 determines whether to enable an additional check based on the physical segments. If the decision step 1009 is false, a decision step 1015 determines whether the current sub-block is the last sub-block of the block to verify. If the decision step 1015 is false, step 1003 selects a next sub-block to be verified. If the decision step 1015 is true, the erase operation passes at step 1016 and the process is done at step 1013. Step 1016 can include setting a pass status for the erase operation.

If the decision step 1009 is true, a decision step 1010 determines, for each physical segment, whether the fail bit count is less than a threshold e.g., a physical segment threshold, PSEG_th. If the decision step 1010 is true, the verify test is passed for the current sub-block. No defect is indicated so that the process can continue at the decision step 1015. That is, in response to determining that a second count is less than the physical segment threshold for each of the physical segments, a control circuit is configured to perform an erase-verify test for a set of NAND strings in another sub-block of the block. If the decision step 1010 is false, step 1011 is reached.

Figure 11:
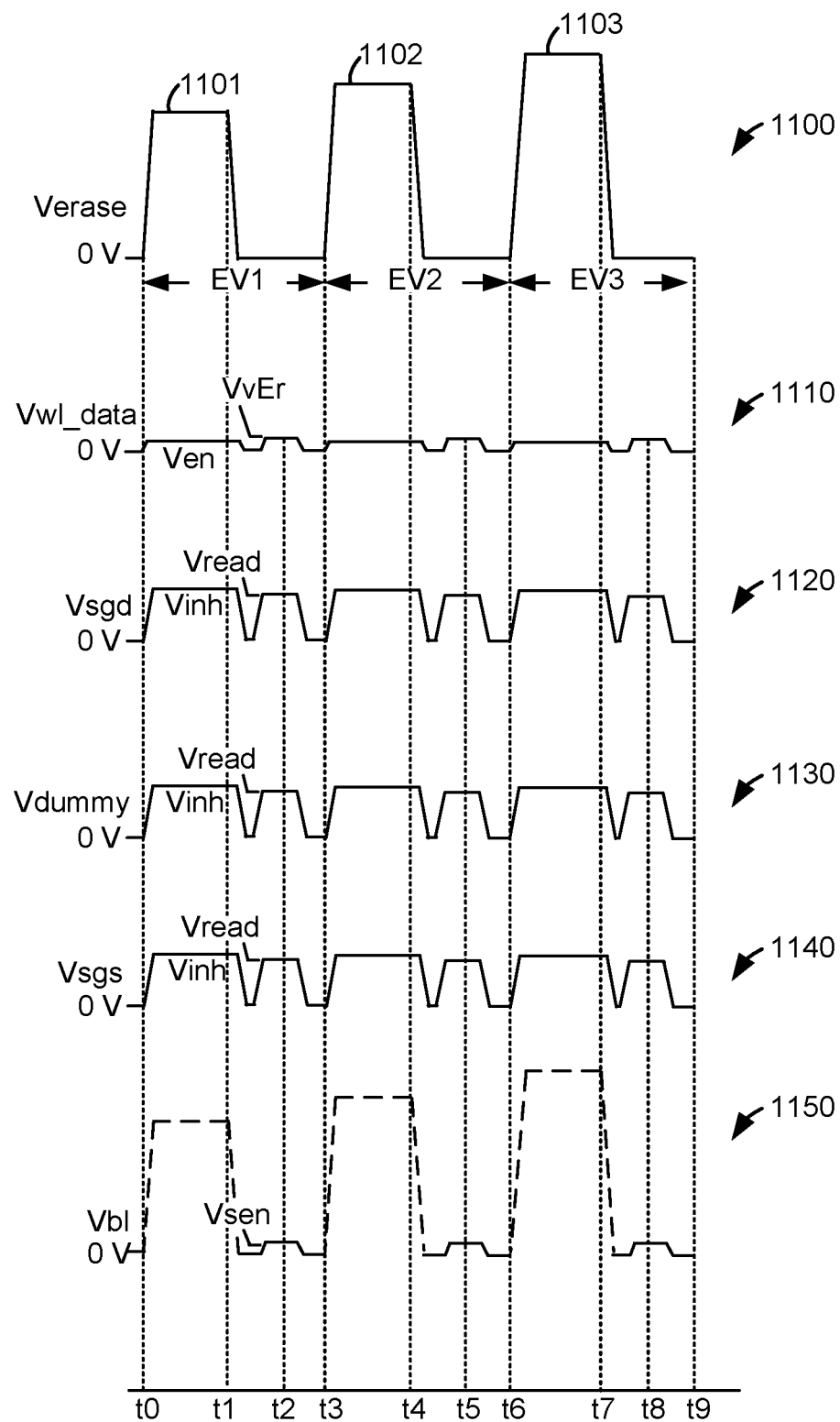
FIG. 11 depicts example voltage signals of an erase operation, consistent with FIG. 10.

FIG. 11 depicts example voltage signals of an erase operation, consistent with FIG. 10. The voltage signals extend over time points t0-t9. The vertical direction indicates voltage and the horizontal direction indicates time.

In this example, the erase operation has three erase-verify loops, EV1-EV3. An erase operation typically has multiple erase-verify loops. Each loop has an erase portion in which an erase pulse is applied to charge up the NAND string channels. For some loops, the erase portion is followed by a verify portion which can include an erase-verify test for the memory cells.

A voltage signal 1100 depicts Verase including erase pulses 1101-1103. The first, second and third erase pulses are at t0-t1, t3-t4 and t6-t7, respectively. The erase voltage can involve a transition from 0 V to a peak voltage, e.g., 15-25 V, which is stepped up in successive erase-verify iterations after the first erase-verify iteration. The channel voltage of the NAND strings will be similar to, and slightly less than, Verase.

A voltage signal 1110 depicts a voltage applied to the data word lines, Vwl_data. This voltage signal increases from 0 V to Ven during each erase pulse. Ven is an erase-enable voltage such as 0-0.5 V. Between the erase pulses, in the verify portion of the erase-verify loops, Vwl_data is set to an erase-verify voltage, VvEr, such as 0 V, at which time a sensing operation (verify test) occurs. The sensing occurs at t2, t5 and t8.

A voltage signal 1120 depicts a voltage applied to the SGD transistors, Vsgd. This voltage signal increases from 0 V to Vinh during each erase pulse. In the verify portion of the erase-verify loops, Vsgd is set to Vread. Vinh is an erase-inhibit voltage such as 10 V, and Vread is a read pass voltage such as 8-10 V.

A voltage signal 1130 depicts a voltage applied to dummy word lines. This voltage signal increases from 0 V to Vinh during each erase pulse. In the verify portion of the erase-verify loops, Vdummy is set to Vread.

A voltage signal 1140 depicts a voltage applied to the SGS transistors, Vsgs. This voltage signal increases from 0 V to Vinh during each erase pulse. In the verify portion of the erase-verify loops, Vsgs is set to Vread.

A voltage signal 1150 depicts a voltage of the bit lines. The bit line voltage Vbl increases as the channel voltage increases. The dashed lines denote a floating voltage. In the verify portion of the erase-verify loops, Vbl is set to Vsen. Vsen is a sensing voltage of the bit line such as 0.8 V.

Figure 12:
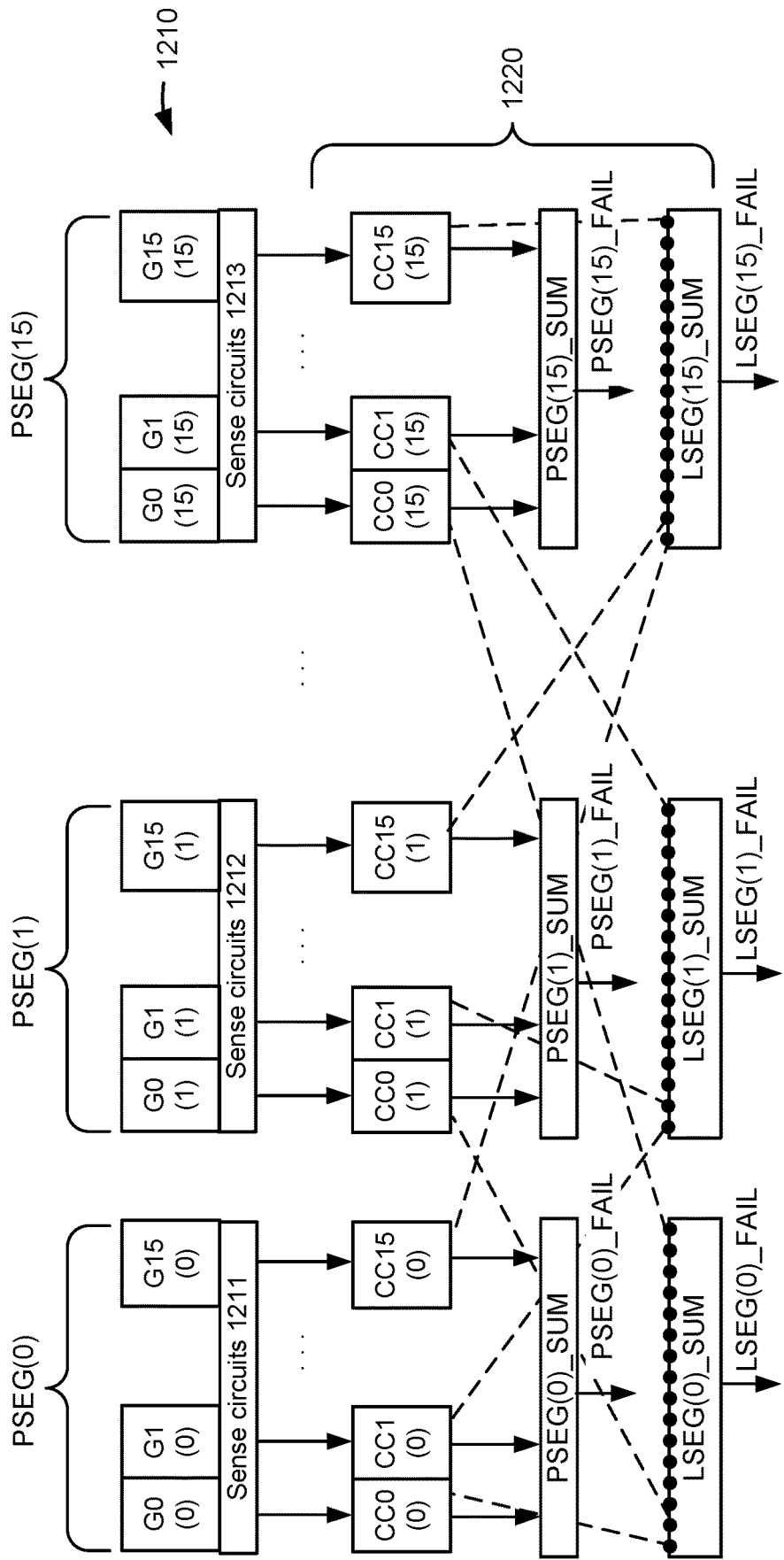
FIG. 12 depicts an example memory device which counts fail bits in physical and logical segments of memory cells, consistent with FIG. 10, where each logical segment is based on fail bits in one group of memory cells per physical segment.

FIG. 12 depicts an example memory device which counts fail bits in physical and logical segments of memory cells, consistent with FIG. 10, where each logical segment is based on fail bits in one group of memory cells per physical segment. A set of NAND strings 1210 represents NAND strings in a sub-block of a block, for example. The set is divided into sixteen physical segments, PSEG(0), PSEG(1), . . . , PSEG(15), in this example. Each physical segment comprises groups of NAND strings, e.g., sixteen groups in this example. For example, PSEG(0) includes groups G0(0), G1(0), . . . , G15(0), PSEG(1) includes groups G0(1), G1(1), . . . , G15(1) and PSEG(15) includes groups G0(15), G1(15), . . . , G15(15). Each group can comprise one or more columns of NAND strings.

Sense circuits 1211, 1212, . . . , 1213 are connected to the groups in PSEG(0), PSEG(1), . . . , PSEG(15), respectively. The sense circuits can include a respective sense circuit for each NAND string such as depicted in FIG. 2B. A pass/fail bit, which represents the result of an erase-verify test for a NAND string, is scanned from each sense circuit by a set of counting circuits 1220. For example, the bits can be transferred to the counting circuits via the bus, DBUS, and the transfer latch XDL, for each NAND string. In this example, the pass/fail bits for a group of NAND strings is transferred to a respective group counting circuit. For example, in PSEG(0), pass/fail bits from groups G0(0), G1(0), . . . , G15(0) are transferred to group counting circuits CC0(0), CC1(0), . . . , CC15(0), respectively. In PSEG(1), pass/fail bits from groups G0(1), G1(1), . . . , G15(1) are transferred to group counting circuits CC0(1), CC1(1), . . . , CC15(1), respectively. In PSEG(15), pass/fail bits from groups G0(15), G1(15), . . . , G15(15) are transferred to group counting circuits CC0(15), CC1(15), . . . , CC15(15), respectively.

Each group counting circuit can count the number of fail bits, for example, in a group of consecutive NAND strings, and pass a signal indicating the number of fail bits to a physical segment summing circuit. For example, in PSEG(0), PSEG(1), . . . , PSEG(15), the signal can be passed to a physical segment summing circuit PSEG(0)_SUM, PSEG(1)_SUM, . . . , PSEG(15)_SUM, respectively. A signal can indicate a number of fail bits based on a number of transitions between high and low levels, or based on a number of pulses. Each physical summing circuit sums the numbers indicated by the signals passed to it to provide a sum of fail bits for the physical segment. For example, the circuits PSEG(0), PSEG(1), . . . , PSEG(15) provide a sum of fail bits, or fail bit count (FBC), as PSEG(0)_FBC, PSEG(1)_FBC, . . . , PSEG(15)_FBC, respectively.

Each sum thus indicates a total number of fail bits in a set of consecutive groups of NAND strings in a physical segment of a sub-block. The sums can be provided to a control circuit such as for use in the process of FIG. 10, step 1010.

The logical segments comprise non-consecutive groups of NAND strings in the set of NAND strings 1210. In this example, each logical segment comprises one group in each physical segment. However, other approaches are possible. For example, in FIG. 13, each logical segment comprises two groups in each physical segment. Generally, a logical segment will have one or more groups, but fewer than all groups, in each physical segment.

Logical segment summing circuits LSEG(0)_SUM, LSEG(1)_SUM, . . . , LSEG(15)_SUM are depicted. Each logical segment summing circuit may have nodes indicated by circles which receive a signal indicating a number of fail bits from a respective group counting circuit. In this example, each logical segment summing circuit has sixteen nodes. The dashed lines represent paths for signals to the logical counting circuits.

Each logical summing circuit sums the numbers indicated by the signals passed to it to provide a sum of fail bits for the logical segment. For example, LSEG(0)_SUM receives signals from CC0(0), CC0(1), . . . , CC0(15), that is, from the first group counting circuit of each physical segment. LSEG(1)_SUM receives signals from CC1(0), CC1(1), CC1(15), that is, from the second group counting circuit of each physical segment. LSEG(15)_SUM receives signals from CC15(0), CC15(1), . . . , CC15(15), that is, from the sixteenth group counting circuit of each physical segment. Each logical summing circuit sums the numbers indicated by the signals passed to it to provide a sum of fail bits for the logical segment. For example, the circuits LSEG(0), LSEG(1), . . . , LSEG(15) provide a sum of fail bits as LSEG(0)_FBC, LSEG(1)_FBC, . . . , LSEG(15)_FBC, respectively.

Each sum thus indicates a total number of fail bits in a set of non-consecutive groups of NAND strings in a logical segment of a sub-block. The sums can be provided to a control circuit such as for use in the process of FIG. 10, step 1008.

Figure 13:
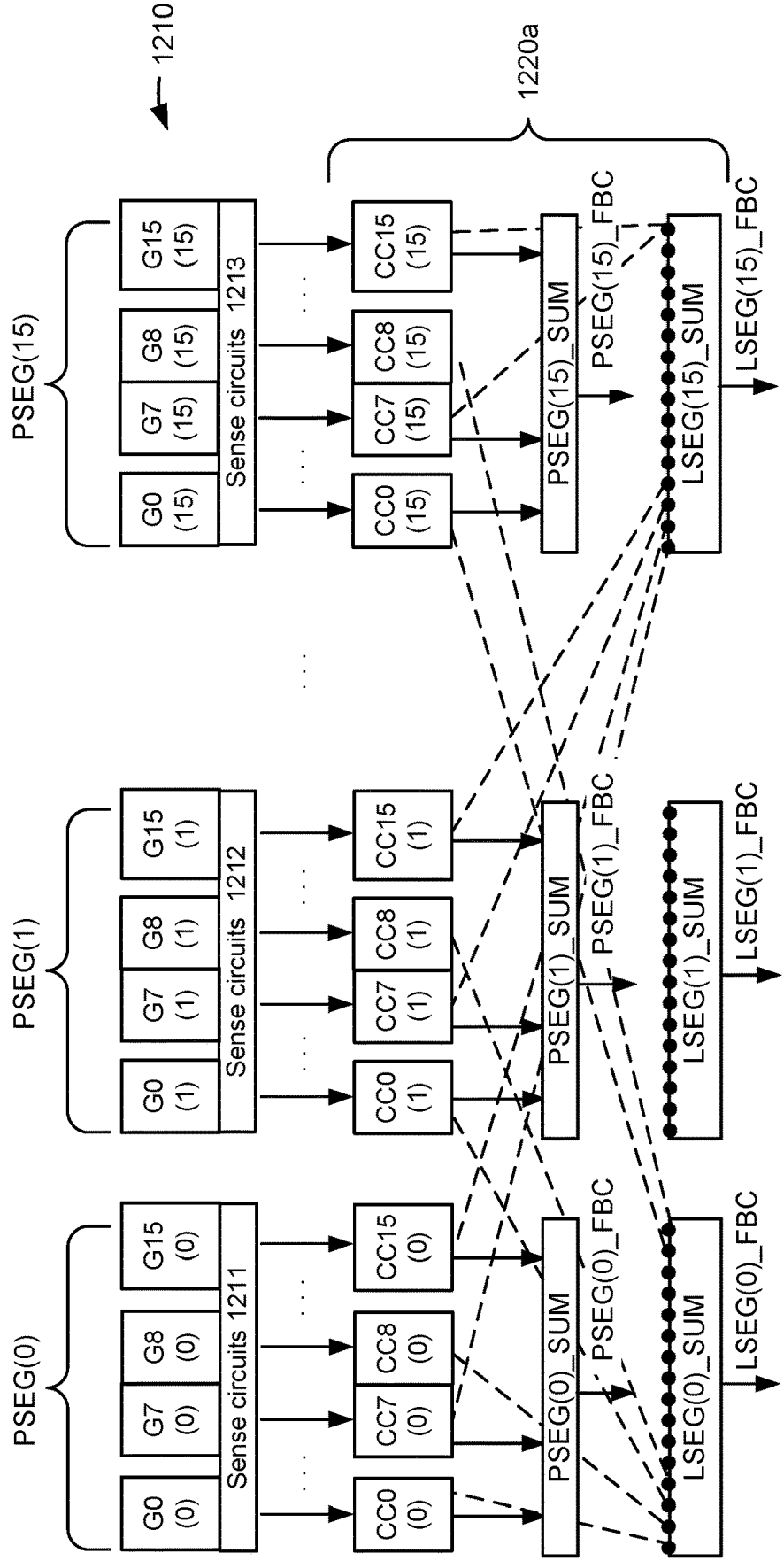
FIG. 13 depicts example circuitry in a memory device which counts fail bits in physical and logical segments of memory cells, consistent with FIG. 10, where each logical segment is based on fail bits in two groups of memory cells per physical segment.

FIG. 13 depicts example circuitry in a memory device which counts fail bits in physical and logical segments of memory cells, consistent with FIG. 10, where each logical segment is based on fail bits in two groups of memory cells per physical segment.

The set of NAND strings 1210 is depicted with the sixteen physical segments, PSEG(0), PSEG(1), . . . , PSEG(15). In the set of counting circuits 1220a, each logical segment summing circuit has nodes indicated by circles which receive signals indicating a number of fail bits from two respective group counting circuits. As before, each logical segment summing circuit has sixteen nodes. Each logical segment comprises two groups in each physical segment. For example, if there are 16 logical segments, the total group amount for each physical segment should 32. This means each logical segment can comprise two groups in each physical segment.

Each logical summing circuit sums the number of fail bits indicated by the signals passed to it to provide a sum of fail bits for the logical segment. For example, LSEG(0)_SUM receives signals from CC0(0) and CC8(0) in PSEG(0), CC0(1) and CC8(1) in PSEG(1), ..., CC0(15) and CC8(15) in PSEG(15), that is, from the first and ninth group counting circuits of each physical segment. Although not shown in the figures, LSEG(1)_SUM receives signals from CC1(0) and CC9(0) in PSEG(0), CC1(1) and CC9(1) in PSEG(1), ..., CC1(15) and CC9(15) in PSEG(15), that is, from the second and tenth group counting circuits of each physical segment. LSEG(15)_SUM receives signals from CC7(0) and CC15(0) in PSEG(0), CC7(1) and CC15(1) in PSEG(1), ..., CC7(15) and CC15(15) in PSEG(15), that is, from the eighth and sixteenth group counting circuits of each physical segment. As before, the circuits LSEG(0), LSEG(1), ..., LSEG(15) provide a sum of fail bits as LSEG(0)_FBC, LSEG(1)_FBC, ..., LSEG(15)_FBC, respectively.

In this example, a number of the physical segments (e.g., 16) is equal to a number of the logical segments. Also, each logical segment of the plurality of logical segments comprises multiple groups of NAND strings (e.g., two groups) in each physical segment. In another approach, the number of the physical segments is different than the number of the logical segments.

In the examples of FIGS. 12 and 13, to determine the first count of fail bits for each logical segment, the control circuit is configured to obtain respective counts of the NAND strings which fail the erase-verify test for at least one group of NAND strings in each of the physical segments, but fewer than all groups of NAND strings in each of the physical segments, and to obtain a sum of the respective counts.

Also, to determine the second count of fail bits for each physical segment, a control circuit is configured to obtain respective counts of the NAND strings which fail the erase-verify test for each group of NAND strings of the physical segment (where the respective counts are obtained at the respective group counting circuits) and to obtain a sum of the respective counts (at the physical segment summing circuits PSEG(0)_SUM, PSEG(1)_SUM, ..., PSEG(15)_SUM).

Figure 14:
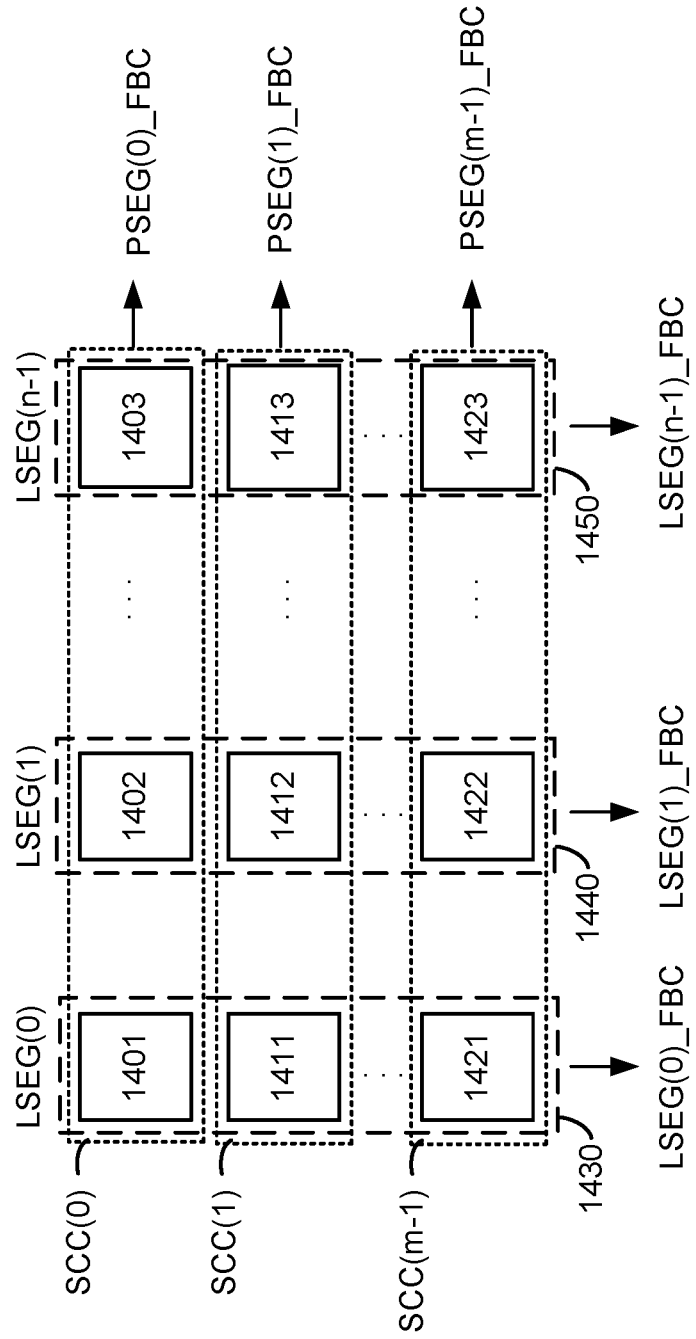
FIG. 14 depicts an example circuit in a memory device which counts fail bits in physical and logical segments of memory cells, consistent with FIG. 10, where the circuitry includes a shooting chain circuit for each physical segment.

FIG. 14 depicts an example circuit in a memory device which counts fail bits in physical and logical segments of memory cells, consistent with FIG. 10, where the circuitry includes a shooting chain circuit for each physical segment. A shooting chain circuit is a type of circuit which allows for fast counting of bit values. A shooting chain circuit comprises a set of tag circuit units. Each tag circuit unit comprises multiple tag circuits, where each tag circuit is in a pass or no pass state based on whether an input bit represents a pass or fail, respectively, of an erase-verify test. Most tag circuits will be in the pass state since a majority of the NAND strings will pass the erase-verify test. A tag circuit in the pass state directly passes the signal to a next tag circuit without changing its level. In contrast, a tag circuit in the no pass state changes the level of the signal to identify the presence of a fail bit. The signal which is output from a series or chain of tag circuits will therefore have a number of transitions or pulses which represents the number of fail bits. The group counting circuits of FIGS. 12 and 13 can be provided by shooting chain circuits, in one possible implementation. For example, SCC(0) can represent CC0(0)-CC15(0), SCC(1) can represent CC0(1)-CC15(1), and SCC(m−1) can represent CC0(14)-CC15(15).

The logical and physical segment summing circuits can include circuitry for counting fail bits by counting the number of transitions or pulses in the signals received from the group counting circuits.

The circuitry comprises a number m of the shooting chain circuits, SCC(0), SCC(1), ..., SCC(m−1), used to provide the physical segment fail bit counts PSEG(0)_FBC, PSEG(1)_FBC, ..., PSEG(m−1)_FBC, respectively. Each shooting chain circuit comprises a set of tag circuit units, one unit for each logical segment. For example, SCC(0) has a set of tag circuit units 1401, 1402, ..., 1403 for LSEG(0), LSEG(1), ..., LSEG(n−1), respectively. SCC(1) has a set of tag circuit units 1411, 1412, ..., 1413 for LSEG(0), LSEG(1), ..., LSEG(n−1), respectively. SCC(m−1) has a set of tag circuit units 1421, 1422, ..., 1423 for LSEG(0), LSEG(1), ..., LSEG(n−1), respectively.

The tag circuit units for each logical segment can be summed across the shooting chain circuits to provide the logical segment fail bit counts LSEG(0)_FBC, LSEG(1)_FBC, ..., LSEG(m−1)_FBC. For example, a set 1430 of tag circuit units 1401, 1411, ..., 1421 associated with LSEG(0) are used to provide LSEG(0)_FBC, a set 1440 of tag circuit units 1402, 1412, ..., 1422 associated with LSEG(1) are used to provide LSEG(1)_FBC, and a set 1450 of tag circuit units 1403, 1413, ..., 1423 associated with LSEG(n−1) are used to provide LSEG(n−1)_FBC.

Figure 15:
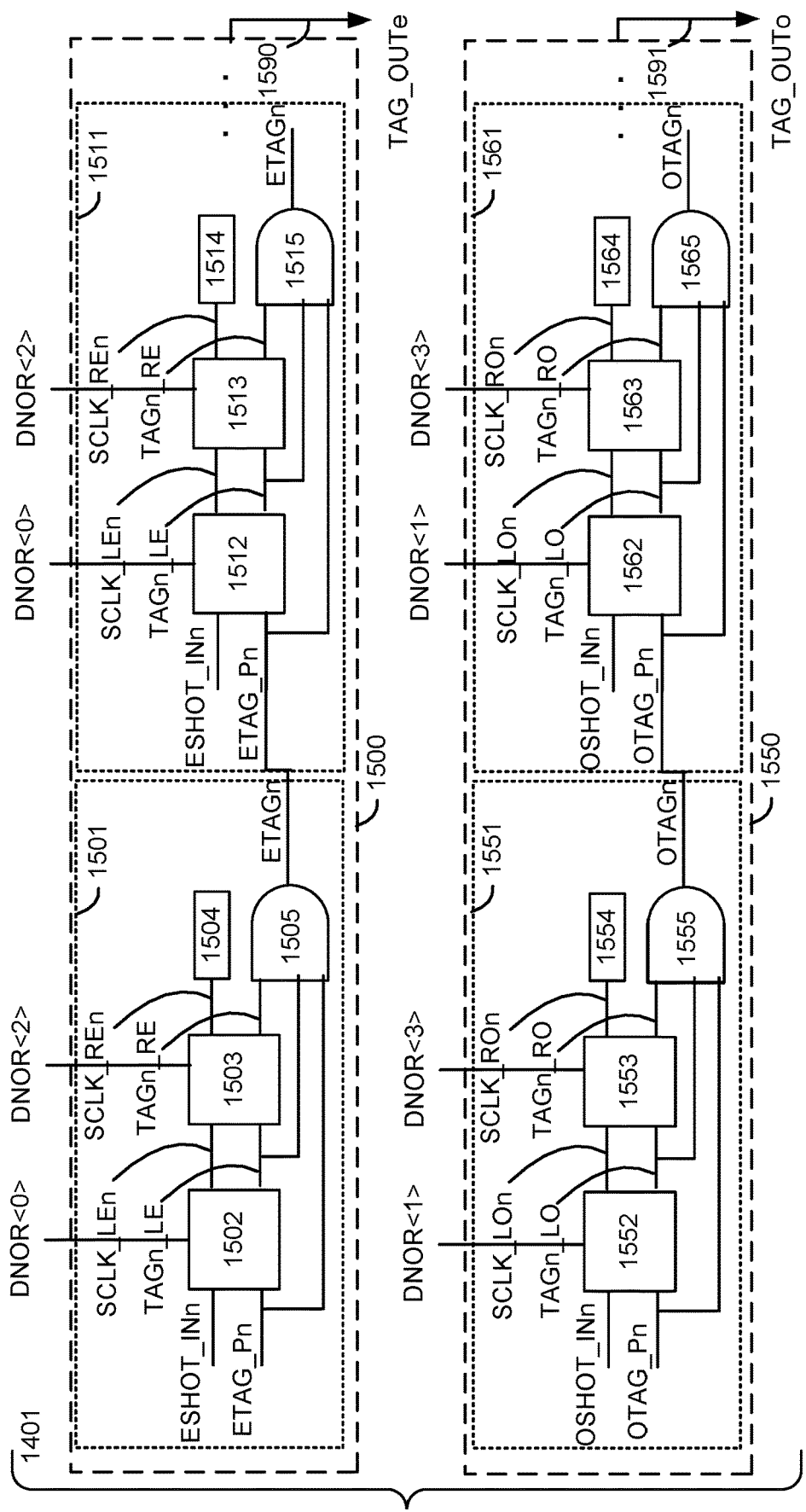
FIG. 15 depicts an example implementation of the tag circuit unit 1401 of the shooting chain circuit SCC(0) of FIG. 14.

FIG. 15 depicts an example implementation of the unit 1401 of the shooting chain circuit SCC(0) of FIG. 14. As mentioned, a set of tag circuits can be arranged serially, in a chain. In this example, there are two sets of tag circuits—one set 1500 for bits in an even-numbered group of bits, and one set 1550 for bits in an odd-numbered group of bits. In a set of bits, a number of bits in the even-numbered group may alternate with a number of bits in the odd-numbered group, in one approach. This grouping is relevant in some memory devices in which alternating groups of sense circuits are in even or odd-numbered groups. For example, bits in the even-numbered group may be from a first half of a page of data and bits in the odd-numbered group may be from a second half of the page of data. The use of different sets of tag circuits in this way is optional.

Many, perhaps hundreds or thousands, of tag circuits can be arranged serially in a set of tag circuits. The processing delay is higher when the number is higher. Further, the tag circuits can be arranged in groups, where each group has multiple tag circuits. The set 1500 includes tag circuit groups 1501 and 1511, and the set 1550 includes tag circuit groups 1551 and 1561. A group has two tag circuits in this example. In another possibility, the tag circuits are not arranged in groups. Each group receives a clock signal and a tag signal, and passes the tag signal to the next group until the final group in the set is reached. The final group passes an output signal to physical and logical segment summing circuits, such as in FIGS. 12 and 13. The output signal indicates a number of fail bits among the bits which were processed by the set of tag circuits. In this example, one output indicates a number of fail bits among the bits which were processed by the set 1500, and another output indicates a number of fail bits among the bits which were processed by the set 1550.

The tag circuit group 1501 includes tag circuits 1502 and 1503. A bit is loaded into the tag circuit 1502 via a path DNOR<0> and a bit is loaded into the tag circuit 1503 via a path DNOR<2>. Each bit value indicates whether the respective tag circuit into which it is loaded will be in a pass or no pass state. A clock signal ESHOT_IN and a tag signal ETAG_Pn are provided to the first tag circuit 1502 in the group. In response, the tag circuit 1502 provides the clock signal SCLK_LEn and the tag signal TAGn_LE to the tag circuit 1503 which may be identical to the tag circuit 1502. The tag circuit 1503 receives the inputs and provides a clock output SCLK_REn to a return node 1504, and a tag signal TAGn_RE to an AND gate 1505. The AND gate also receives ETAG_Pn and TAGn_LE and provides a high output if each of the inputs is high; otherwise, it provides a low output. The output ETAGn is provided as the input to the next tag circuit 1512.

In the tag circuit group 1511, a bit is loaded into the tag circuit 1512 via a path DNOR<0> and a bit is loaded into the tag circuit 1513 via a path DNOR<2>. The tag circuit 1512 receives the same clock signal ESHOT_INn as the other tag circuits in the set. It operates in the same way as described to provide a clock and tag signals to the tag circuit 1513. The tag circuit 1513 receives the inputs and provides the clock output SCLK_REn to a return node 1514, and the tag signal TAGn_RE to an AND gate 1515. The output ETAGn of the AND gate is provided as the input to the next tag circuit. The last tag circuit in the set provides an output TAG_OUTe on an output path 1590 which includes high and low levels which indicate a count of fail bits.

The set 1550 operates similarly as the set 1500 but processes the bits of the odd-numbered group. The tag circuit group 1551 includes tag circuits 1552 and 1553. A bit is loaded into the tag circuit 1552 via a path DNOR<1> and a bit is loaded into the tag circuit 1553 via a path DNOR<3>. A clock signal OSHOT_IN and a tag signal OTAG_Pn are provided to the tag circuit 1552. In response, the tag circuit 1552 provides the clock signal SCLK_LOn and the tag signal TAGn_LO to the tag circuit 1553. The tag circuit 1553 receives the inputs and provides a clock output SCLK_ROn to a return node 1554, and a tag signal TAGn_RO to an AND gate 1555. The AND gate also receives OTAG_Pn and TAGn_LO. The output OTAGn is provided as the input to the next tag circuit 1562.

In the tag circuit group 1561, a bit is loaded into the tag circuit 1562 via a path DNOR<1> and a bit is loaded into the tag circuit 1563 via a path DNOR<3>. The tag circuit 1562 receives the same clock signal OSHOT_INn as the other tag circuits in the set. It operates in the same way as described previously to provide a clock and tag signals to the tag circuit 1563. The tag circuit 1563 receives the inputs and provides the clock output SCLK_ROn to a return node 1564, and the tag signal TAGn_RO to an AND gate 1565. The output OTAGn of the AND gate is provided as the input to the next tag circuit. The last tag circuit in the set provides an output TAG_OUTo on an output path 1591 which includes high and low levels which indicate a count of fail bits.

In an implementation in which the separate even-odd bit counts are not used, one of the sets of tag circuits can be omitted.

Each set of tag circuits is sometimes referred to as a shooting chain because a SHOT pulse can pass through it very quickly if the tag circuits are all in the pass state. When a tag circuit receives the SHOT signal, it decides based on the TAG input whether to reset the tag circuit. A number of tag circuits can share the same SHOT and have their TAG inputs connected in series. By reducing the step of sending one SHOT pulse to see if there are any TAG signals to count, the overhead is reduced.

Figure 16:
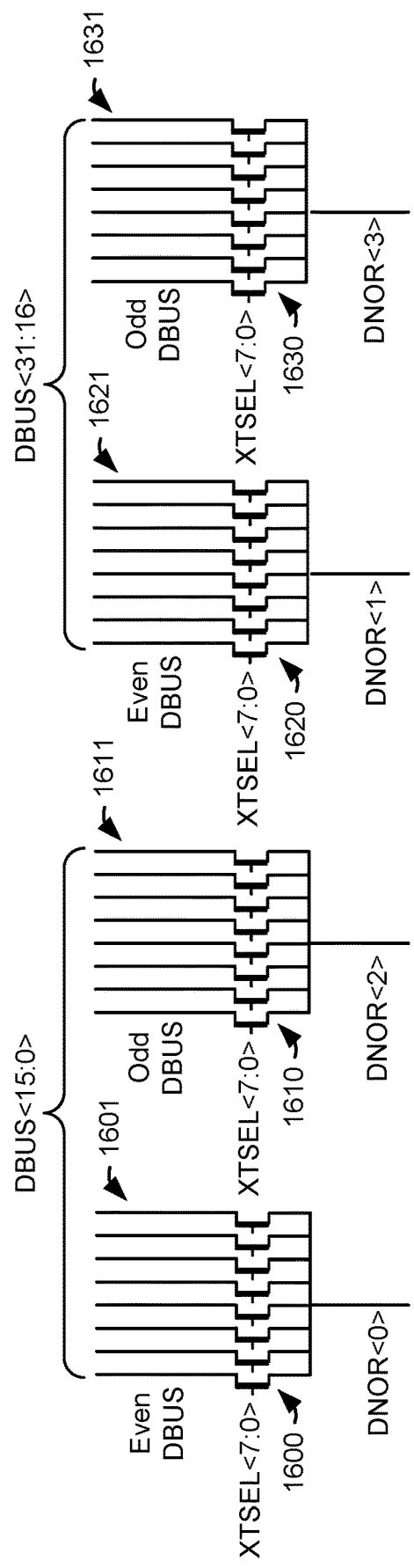
FIG. 16 depicts an example circuit for loading bits into the tag circuits of FIG. 15.

FIG. 16 depicts an example circuit for loading bits into the tag circuits of FIG. 15. The input paths DNOR<0> to DNOR<3> to the tag circuits of FIG. 15 are depicted. In this example, in a set of eight bits, one bit at a time is loaded into a tag circuit from DBUS via DNOR<0> by selecting each of the select transistors in a set of select transistors 1600 in turn. A select signal XTSEL<7:0> is used to control each set of the select transistors. The bits are provided on even-numbered buses 1601 (Even DBUS). Similarly, one bit at a time is loaded into another tag circuit via DNOR<2> by selecting each of the select transistors in a set of select transistors 1610 in turn. The bits are provided on odd-numbered buses 1611 (Odd DBUS). Bits are loaded into another tag circuit via DNOR<1> using a set of select transistors 1620 and buses 1621, and bits are loaded into another tag circuit via DNOR<3> using a set of select transistors 1630 and buses 1631.

Accordingly, it can be seen that in one implementation, an apparatus comprises: a control circuit configured to connect to a set of NAND strings, the NAND strings comprises memory cells. The control circuit is configured to: bias the set of NAND strings for erase; after the biasing, perform an erase-verify test for the set of memory cells; determine a first count of NAND strings which fail the erase-verify test for each logical segment of a plurality of logical segments, each logical segment comprising non-consecutive groups of NAND strings of the set of NAND strings; if the first count for each logical segment is less than a logical segment threshold, determine a second count of NAND strings which fail the erase-verify test for each physical segment of a plurality of physical segments, each physical segment comprising consecutive groups of NAND strings of the set of NAND strings; and determine whether the second count for each physical segment is less than a physical segment threshold.

In another implementation, a method comprises: performing one or more erase-verify iterations of an erase operation for a sub-block of memory cells until the sub-block passes an erase-verify test for each logical segment of a plurality of logical segments of the sub-block; in response to the sub-block passing the erase-verify test for each logical segment of the plurality of logical segments of the sub-block, determining whether the sub-block passes the erase-verify test for each physical segment of a plurality of physical segments of the sub-block; and setting a fail status for the erase operation if the sub-block does not pass the erase-verify test for each physical segment of the plurality of physical segments of the sub-block.

In another implementation, an apparatus comprises: a control circuit configured to connect to a set of NAND strings, the set of NAND strings are arranged in plurality of logical segments and in a plurality of physical segments; and an interface connected to the control circuit. The control circuit is configured to issue commands via the interface to: perform an erase-verify test for the set of NAND strings; set a fail bit for each NAND string of the set of NAND strings which fails the erase-verify test; count the fail bits at group counting circuits, each group counting circuit is configured to count fail bits from a respective group of NAND strings of the set of NAND strings; for each physical segment of the plurality of physical segments, sum fail bits of consecutive groups of NAND strings of the set of NAND strings to provide a sum of fail bits for the physical segment; for each logical segment of the plurality of logical segments, sum fail bits of non-consecutive groups of NAND strings of the set of NAND strings; to provide a sum of fail bits for the logical segment; for each logical segment of the plurality of logical segments, determine that the sum of fail bits for the logical segment is less than a logical segment threshold; and determine whether to set a fail flag for the set of NAND strings based on the sum of fail bits for each physical segment of the plurality of physical segments.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of NAND strings, the NAND strings comprises memory cells, the control circuit is configured to:
bias the set of NAND strings for erase;
after the biasing, perform an erase-verify test for the set of NAND strings;
for each group of a plurality of groups of NAND strings of the set of NAND strings, determine a number of fail bits;
determine a first count of NAND strings which fail the erase-verify test for each logical segment of a plurality of logical segments, each logical segment comprising non-consecutive groups of NAND strings of the set of NAND strings, each first count is a sum of numbers of fail bits for corresponding non-consecutive groups of NAND strings;
if the first count for each logical segment is less than a logical segment threshold, determine a second count of NAND strings which fail the erase-verify test for each physical segment of a plurality of physical segments, each physical segment comprising consecutive groups of NAND strings of the set of NAND strings, each second count is a sum of numbers of fail bits for corresponding consecutive groups of NAND strings; and
determine whether the second count for each physical segment is less than a physical segment threshold.

2. The apparatus of claim 1, wherein:
in response to determining that the second count is not less than the physical segment threshold for at least one of the physical segments, marking the set of NAND strings as being bad.

3. The apparatus of claim 1, wherein:
the set of NAND strings is biased for erase in an erase operation; and
in response to determining that the second count is less than the physical segment threshold for each of the physical segments, the control circuit is configured to set a pass status for the erase operation.

4. The apparatus of claim 1, wherein:
the set of NAND strings is in a sub-block of a block of NAND strings biased for erase; and
in response to determining that the second count is less than the physical segment threshold for each of the physical segments, the control circuit is configured to perform an erase-verify test for a set of NAND strings in another sub-block of the block.

5. The apparatus of claim 1, wherein:
if the first count is greater than the logical segment threshold for at least one of the logical segments, the control circuit is configured to bias the set of NAND strings again for erase.

6. The apparatus of claim 1, wherein:
a number of the physical segments is equal to a number of the logical segments.

7. The apparatus of claim 1, wherein:
a number of the physical segments is different than a number of the logical segments.

8. The apparatus of claim 1, wherein:
each logical segment of the plurality of logical segments comprises multiple groups of NAND strings in each physical segment.

9. The apparatus of claim 1, wherein:
to determine the second count for each physical segment, the control circuit is configured to obtain respective counts of the NAND strings which fail the erase-verify test for each group of NAND strings of the physical segment and to obtain a sum of the respective counts.

10. The apparatus of claim 1, wherein:
to determine the first count for each logical segment, the control circuit is configured to obtain respective counts of the NAND strings which fail the erase-verify test for at least one group of NAND strings in each of the physical segments, but fewer than all groups of NAND strings in each of the physical segments, and to obtain a sum of the respective counts.

11. A method, comprising:
performing one or more erase-verify iterations of an erase operation for a sub-block of memory cells until the sub-block passes an erase-verify test for each logical segment of a plurality of logical segments of the sub-block, each logical segment formed of non-consecutive groups of NAND strings;
in response to the sub-block passing the erase-verify test for each logical segment of the plurality of logical segments of the sub-block, determining whether the sub-block passes the erase-verify test for each physical segment of a plurality of physical segments of the sub-block, each physical segment formed of consecutive groups of NAND strings; and
setting a fail status for the erase operation if the sub-block does not pass the erase-verify test for each physical segment of the plurality of physical segments of the sub-block.

12. The method of claim 11, further comprising:
setting a pass status for the erase operation if the sub-block passes the erase-verify test for each physical segment of the plurality of physical segments of the sub-block and there is no further sub-block in the block subject to the erase-verify test.

13. The method of claim 11, wherein:
the sub-block passes the erase-verify test for each logical segment of the plurality of logical segments when each logical segment of the plurality of logical segments has a fail bit count below a logical segment threshold; and
the sub-block passes the erase-verify test for each physical segment of the plurality of logical segments when each physical segment of the plurality of logical segments has a fail bit count below a physical segment threshold.

14. The method of claim 11, wherein:
the sub-block comprises a set of NAND strings;
each physical segment comprises consecutive groups of NAND strings of the set of NAND strings; and
each logical segment comprises non-consecutive groups of NAND strings of the set of NAND strings.

15. The method of claim 11, further comprising:
if the sub-block passes the erase-verify test for each physical segment of the plurality of physical segments of the sub-block, performing an erase-verify test for another sub-block of the block.

16. An apparatus, comprising:

a control circuit configured to connect to a set of NAND strings, the set of NAND strings are arranged in groups of NAND strings, a plurality of logical segments are each formed of non-consecutive groups of NAND strings and a plurality of physical segments are each formed of consecutive groups of NAND strings; and an interface connected to the control circuit, the control circuit is configured to issue commands via the interface to:

perform an erase-verify test for the set of NAND strings;

set a fail bit for each NAND string of the set of NAND strings which fails the erase-verify test;

count the fail bits at group counting circuits, each group counting circuit is configured to count fail bits from a respective group of NAND strings of the set of NAND strings;

for each physical segment of the plurality of physical segments, sum fail bits of consecutive groups of NAND strings of the set of NAND strings that form the physical segment to provide a sum of fail bits for the physical segment;

for each logical segment of the plurality of logical segments, sum fail bits of non-consecutive groups of NAND strings of the set of NAND strings that form the logical segment to provide a sum of fail bits for the logical segment;

for each logical segment of the plurality of logical segments, determine that the sum of fail bits for the logical segment is less than a logical segment threshold; and determine whether to set a fail flag for the set of NAND strings based on the sum of fail bits for each physical segment of the plurality of physical segments.

17. The apparatus of claim 16, wherein:

the control circuit is configured to issue a command via the interface to set the fail flag when the sum of fail bits for at least one of the physical segments is not less than a physical segment threshold.

18. The apparatus of claim 16, wherein:

the erase-verify test is performed in an erase operation; and the control circuit is configured to set a pass status for the erase operation when the sum of fail bits for each of the physical segments is less than a physical segment threshold, and when there is no further erase-verify test to perform in the erase operation.

19. The apparatus of claim 16, wherein:

the erase-verify test is performed in an erase operation; and the control circuit is configured to issue a command via the interface to perform an erase-verify test for another set of NAND strings when the sum of fail bits for each of the physical segments is less than a physical segment threshold, and when the another set of NAND strings has not yet been subject to the erase-verify test in the erase operation.

20. The apparatus of claim 16, wherein:

the set of NAND strings is connected to a set of word lines; and the erase-verify test comprises an erase-verify test for even-numbered word lines and a separate erase-verify test for odd-numbered word lines.

\* \* \* \* \*